(12) United States Patent
Guo et al.

(10) Patent No.: US 11,778,779 B2
(45) Date of Patent: Oct. 3, 2023

(54) ELECTRONIC COMPONENT COOLING DEVICE

(71) Applicant: DENSO CORPORATION, Kariya (JP)

(72) Inventors: Xiaolin Guo, Nisshin (JP); Koji Asagara, Nisshin (JP); Kazuya Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 573 days.

(21) Appl. No.: 16/689,879

(22) Filed: Nov. 20, 2019

(65) Prior Publication Data

US 2020/0170144 A1 May 28, 2020

(30) Foreign Application Priority Data

Nov. 22, 2018 (JP) .................................. 2018-219324

(51) Int. Cl.
*H05K 7/20* (2006.01)
*G05B 15/02* (2006.01)

(52) U.S. Cl.
CPC ......... *H05K 7/20281* (2013.01); *G05B 15/02* (2013.01); *H05K 7/20263* (2013.01);
(Continued)

(58) Field of Classification Search
CPC ...... F28D 15/00; F28D 15/0233; F28D 15/02; F28D 15/0275; F28D 2021/0028; F28F 13/00; F28F 27/00; H01L 23/31; H01L 23/34; H01L 23/3672; H01L 23/46; H01L 23/427; H01L 23/473; G06F 1/20; G06F 1/203; G06F 1/1635; G06F 2200/201; H05K 7/20; H05K 7/20154; H05K 7/20218; H05K 7/20236; H05K 7/20254; H05K 7/20263; H05K 7/20272; H05K 7/20281; H05K 7/20309–20327; H05K 7/20336;
(Continued)

(56) References Cited

U.S. PATENT DOCUMENTS 5,517,757 A * 5/1996 Hayashi ............... B60H 1/3227
29/890.039
9,818,673 B2 * 11/2017 Mizuno ................... F28F 3/025
(Continued)

FOREIGN PATENT DOCUMENTS

JP 2005-116256 A 4/2005
JP 2005-129448 A 5/2005
(Continued)

*Primary Examiner* — Amir A Jalali
(74) *Attorney, Agent, or Firm* — Oliff PLC

(57) ABSTRACT

In an electronic component cooling device, a cooler cools an electronic component, a coolant temperature acquisition unit acquires a temperature of a coolant, a coolant flow rate acquisition unit acquires the flow rate of the coolant, a heat loss estimation unit estimates a heat loss from the electronic component, and a loss threshold calculation unit calculates an upper limit threshold of the heat loss from the electronic component based on the coolant temperature and the coolant flow rate. A coolant flow rate control unit controls the flow rate of the coolant and is configured to, in response to an estimated heat loss which is the heat loss from the electronic component that has been estimated by the heat loss estimation unit exceeding the upper limit threshold, increase the flow rate of the coolant circulating through the cooler.

6 Claims, 16 Drawing Sheets

(52) U.S. Cl.
CPC ..... *H05K 7/20272* (2013.01); *H05K 7/20872* (2013.01); *H05K 7/20927* (2013.01); *H05K 7/20945* (2013.01)

(58) Field of Classification Search
CPC ............. H05K 7/20381; H05K 7/2039; H05K 7/2029; H05K 7/20509; H05K 7/20663; H05K 7/20681; H05K 7/20709; H05K 7/20763; H05K 7/20772; H05K 7/20809; H05K 7/20818; H05K 7/20827; H05K 7/20836; H05K 7/20854; H05K 7/20872; H05K 7/20881; H05K 7/20936; H05K 7/20927; H05K 7/20954; H01H 9/52
See application file for complete search history.

(56) References Cited

U.S. PATENT DOCUMENTS

| | | | | |
|---|---|---|---|---|
| 2003/0062149 | A1* | 4/2003 | Goodson | H01L 23/473 |
| | | | | 257/E23.098 |
| 2003/0085024 | A1* | 5/2003 | Santiago | B01D 19/0031 |
| | | | | 257/E23.098 |
| 2006/0180300 | A1* | 8/2006 | Lenehan | H01L 23/34 |
| | | | | 257/E23.098 |
| 2007/0269336 | A1 | 11/2007 | Ohki et al. | |
| 2009/0126909 | A1* | 5/2009 | Ellsworth, Jr. | H05K 7/20772 |
| | | | | 361/699 |
| 2010/0126666 | A1 | 5/2010 | Tandou et al. | |
| 2010/0263855 | A1* | 10/2010 | Arimilli | G05D 23/1931 |
| | | | | 165/288 |
| 2011/0060470 | A1* | 3/2011 | Campbell | G05D 23/1934 |
| | | | | 700/282 |
| 2011/0132541 | A1* | 6/2011 | Tandou | H01L 21/67017 |
| | | | | 156/345.27 |
| 2012/0118534 | A1* | 5/2012 | Goth | H05K 7/20781 |
| | | | | 165/104.33 |
| 2012/0120603 | A1* | 5/2012 | Campbell | H05K 7/20781 |
| | | | | 361/698 |
| 2012/0205086 | A1* | 8/2012 | Nakamura | F28F 3/08 |
| | | | | 165/181 |
| 2012/0273132 | A1 | 11/2012 | Tandou et al. | |
| 2013/0128918 | A1* | 5/2013 | Campbell | H05K 7/20836 |
| | | | | 374/57 |
| 2013/0138253 | A1* | 5/2013 | Chainer | H05K 7/20836 |
| | | | | 700/282 |
| 2013/0333865 | A1* | 12/2013 | Goth | H05K 7/20836 |
| | | | | 165/104.31 |
| 2013/0345893 | A1* | 12/2013 | David | G05D 23/00 |
| | | | | 700/300 |
| 2014/0202678 | A1* | 7/2014 | Goth | H05K 7/20763 |
| | | | | 165/200 |
| 2018/0112933 | A1* | 4/2018 | Takagi | F28D 1/05325 |
| 2020/0075452 | A1* | 3/2020 | Matsuzawa | H01L 23/3672 |

FOREIGN PATENT DOCUMENTS

| | | | | |
|---|---|---|---|---|
| JP | 2008-151380 A | | 7/2008 | |
| JP | 2012-169429 A | | 9/2012 | |
| JP | 2018074121 | * | 5/2018 | ............ H01I 23/473 |

* cited by examiner

ELECTRONIC COMPONENT COOLING DEVICE

CROSS-REFERENCE TO RELATED APPLICATION

This application is based on and claims the benefit of priority from earlier Japanese Patent Application No. 2018-219324 filed Nov. 22, 2018, the description of which is incorporated herein by reference.

BACKGROUND

Technical Field

The present disclosure relates to electronic component cooling devices.

Related Art

Some cooling devices for cooling an electronic component are known that circulate a liquid coolant to effect heat exchange between the electronic component and the coolant. In such cooling devices, the coolant may boil as a result of an increase in the temperature of the coolant that has received heat from the electronic component. Furthermore, if dry-out occurs in the coolant inside a cooler in a portion in thermal contact with the electronic component, there is a risk of insufficient cooling of the electronic component. Therefore, dry-out prevention is required.

DESCRIPTION OF SPECIFIC EMBODIMENTS

Figure 1:
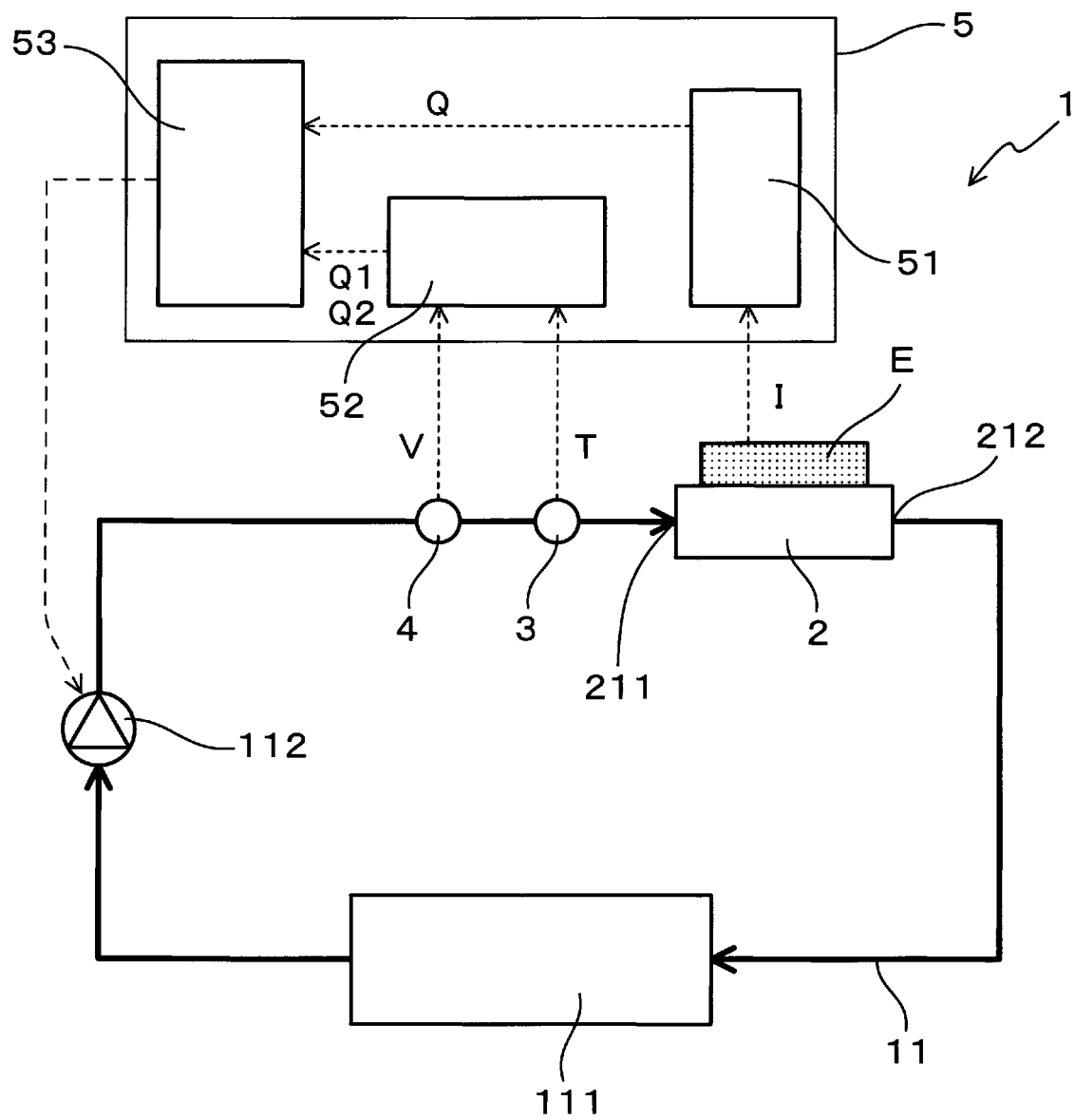
FIG. 1 conceptually illustrates an electronic component cooling device according to a first embodiment.

A cooling device as disclosed in JP-A-2011-119515 controls a cooling cycle to reduce the amount of a circulating coolant within a range in which dry-out does not occur in an evaporator. In addition, the cooling device of JP-A-2011-119515 prevents dry-out by controlling the amount of the circulating coolant according to the degree of dryness of the coolant that has passed through the evaporator.

However, use of a technique as disclosed in the above JP-A-2011-119515 to control a coolant in a cooling device for an electronic component imposes a limitation on the cooling device.

Specifically, with the feature of controlling the amount of the circulating coolant according to the degree of dryness of the coolant that has passed through the evaporator as mentioned above, said method is only applicable to a cooling system including at least an evaporator. In other words, it is necessary to have a cooling cycle including an evaporator, a compressor, a condenser, and an expansion valve. Thus, with a narrow range of application, the technique disclosed in JP-A-2011-119515 is not always an easy method for efficiently cooling an electronic component.

In view of the above, it is desired to have an electronic component cooling device which easily enables efficient cooling of an electronic component.

Hereinafter, exemplary embodiments of the present disclosure will be described in detail with reference to the accompanying drawings, in which like reference numerals refer to like or similar elements regardless of reference numerals and duplicated description thereof will be omitted.

First Embodiment

An embodiment of an electronic component cooling device is described with reference to FIGS. 1 and 2.

As illustrated in FIG. 1, an electronic component cooling device 1 according to the present embodiment includes a cooler 2, a coolant temperature acquisition unit 3, a coolant flow rate acquisition unit 4, a heat loss estimation unit 51, a loss threshold calculation unit 52, and a coolant flow rate control unit 53.

The cooler 2 cools an electronic component E by circulating a coolant through the cooler 2. The coolant temperature acquisition unit 3 acquires the temperature of the coolant that is introduced into the cooler 2. The coolant flow rate acquisition unit 4 acquires the flow rate of the coolant that circulates through the cooler 2. The heat loss estimation unit 51 estimates a heat loss from the electronic component E. The loss threshold calculation unit 52 calculates an upper limit threshold Q1 of the heat loss from the electronic component E based on a coolant temperature T acquired by the coolant temperature acquisition unit 3 and a coolant flow rate V acquired by the coolant flow rate acquisition unit 4. The coolant flow rate control unit 53 controls the flow rate of the coolant that circulates through the cooler 2.

The coolant flow rate control unit 53 is configured to, when an estimated heat loss Q exceeds the upper limit threshold Q1, increase the flow rate of the coolant that circulates through the cooler 2. The estimated heat loss Q is the heat loss from the electronic component E that has been estimated by the heat loss estimation unit 51.

The cooler 2 is formed from a highly thermally-conductive metal such as aluminum. The electronic component E is disposed in thermal contact with the cooler 2. Specifically, the electronic component E is disposed in direct contact with a surface of the cooler 2 or in thermal contact with the cooler 2 via a thermally-conductive member. Furthermore, the electronic component E may be disposed in direct contact with the coolant.

The cooler 2 has a coolant inlet 211 through which the coolant is introduced and a coolant outlet 212 through which the coolant is discharged. A coolant circulation path 11 through which the coolant circulates is connected to each of the coolant inlet 211 and the coolant outlet 212. A tank 111 and a pump 112 are provided in the coolant circulation path 11.

The pump 112 feeds the coolant stored in the tank 111 to the cooler 2 through the coolant inlet 211. The coolant discharged through the coolant outlet 212 of the cooler 2 returns to the tank 111. The coolant discharged from the cooler 2 is a high-temperature coolant resulting from heat exchange with the electronic component E. The heat of this coolant is dissipated by air cooling or the like inside the tank 11 or before or after the tank 111 in the coolant circulation path 11. Subsequently, the resultant low-temperature coolant is introduced back into the cooler 2.

In the present embodiment, the coolant temperature acquisition unit 3 may be a temperature sensor provided near the coolant inlet 211. The temperature sensor (that is, the coolant temperature acquisition unit 3) may be provided in the coolant circulation path 11, in a position upstream of the coolant inlet 211, or may be provided in the cooler 2, near the coolant inlet 211. The installation site for the coolant temperature acquisition unit 3 is not limited as long as the coolant temperature acquisition unit 3 can acquire the temperature of the coolant that is introduced into the cooler 2 before heat exchange with the electronic component E.

The coolant flow rate acquisition unit 4 may be a flowmeter that measures a coolant flow rate. In the present embodiment, the coolant flow rate acquisition unit 4 is provided between the pump 112 and the cooler 2 in the coolant circulation path 11. The flowmeter may be provided in the cooler 2. For example, the flowmeter may be provided at the coolant inlet 211 in the cooler 2, may be provided at the coolant outlet 212, or may be provided between the coolant inlet 211 and the coolant outlet 212. The installation site for the coolant flow rate acquisition unit 4 is not limited as long as the coolant flow rate acquisition unit 4 can acquire the flow rate of the coolant in the cooler 2.

In the present embodiment, the heat loss estimation unit 51 may be configured to estimate the heat loss from the electronic component E from the electric current value of the electronic component E. Together with the loss threshold calculation unit 52 and the coolant flow rate control unit 53, the heat loss estimation unit 51 is provided in an electronic control unit (ECU) 5. Note that, for example, an electric current sensor provided on the electronic component E or a wire connected to the electronic component E can be used to acquire the electric current value of the electronic component E.

The loss threshold calculation unit 52 is configured to calculate a lower limit threshold Q2 of the heat loss from the electronic component E based on the coolant temperature T acquired by the coolant temperature acquisition unit 3 and the coolant flow rate V acquired by the coolant flow rate acquisition unit 4. The lower limit threshold Q2 is less than the upper limit threshold Q1.

The coolant flow rate control unit 53 is configured to, when the estimated heat loss Q falls below the lower limit threshold Q2, decreases the flow rate of the coolant that circulates through the cooler 2.

Figure 2:
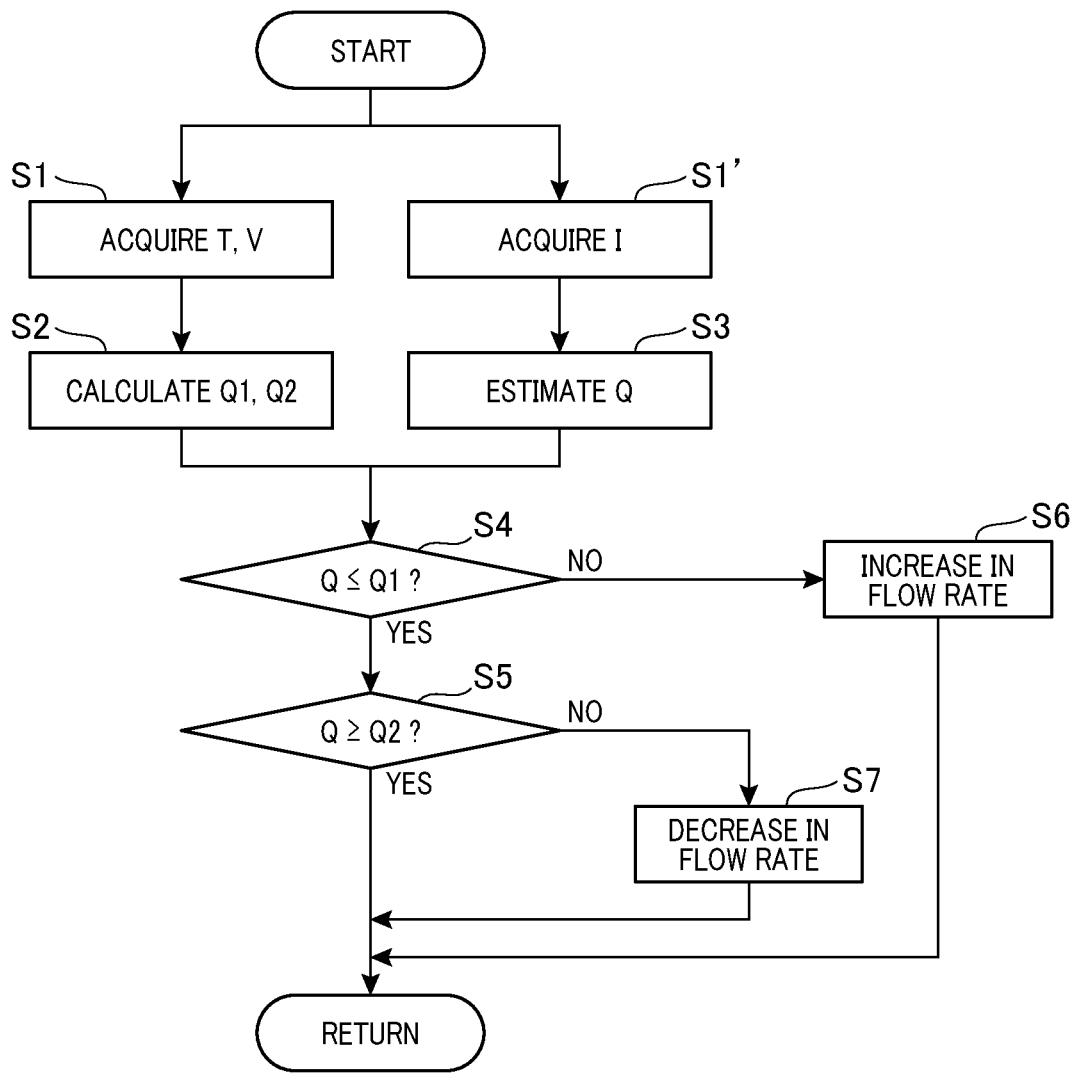
FIG. 2 is a flowchart of coolant control in the electronic component cooling device according to the first embodiment.

Next, with reference to the flowchart in FIG. 2, one example of a method for controlling the coolant flow rate in the electronic component cooling device 1 according to the present embodiment is described.

First, the temperature sensor serving as the coolant temperature acquisition unit 3, the flowmeter serving as the coolant flow rate acquisition unit 4, and moreover the electric current sensor that acquires the electric current in the electronic component E acquire the coolant temperature T, the coolant flow rate V, and an electric current value I of an electric current flowing to the electronic component E, respectively (refer to steps S1, S1').

Next, the upper limit threshold Q1 and the lower limit threshold Q2 are calculated from the coolant temperature T and the coolant flow rate V (refer to step S2). Here, the upper limit threshold Q1 can be set as an upper limit value of an appropriate range of the heat loss from the electronic component E in which proper handling is possible in the current state of the coolant (specifically, the coolant temperature and the coolant flow rate). In other words, if the heat loss from the electronic component E is too high for the current coolant, dry-out of the coolant may occur. Specifically, the coolant may boil for an internal combustion engine of the cooler 2, resulting in a layer of an evaporated coolant being interposed between the liquid coolant and a portion of the cooler 2 that thermally contacts the electronic component E. In such a dry-out state, the cooling performance of the coolant for the electronic component E is significantly reduced; thus, such a state needs to be avoided.

The heat loss from the electronic component E with which dry-out begins to occur varies according to the current coolant temperature and coolant flow rate. Specifically, as the current coolant temperature increases, the heat loss from the electronic component E with which dry-out begins to occur is reduced, and as the current coolant flow rate decreases, the heat loss from the electronic component E with which dry-out begins to occur is reduced.

In other words, an approximate heat loss from the electronic component E with which dry-out can be avoided varies according to the coolant temperature T and the coolant flow rate V. Therefore, first, T and V are used to calculate the upper limit threshold Q1 as the upper limit value of a reasonable heat loss with which dry-out can be avoided.

The lower limit threshold Q2 can be set as a lower limit value of an appropriate range of the heat loss from the electronic component E. In other words, if the heat loss from the electronic component E is too low for the current coolant, the cooling performance of the coolant is considered as over-engineering. This means that the current coolant temperature, flow rate, etc., have been set in the state where higher cooling ability than necessary is exhibited. Thus, there could be room for improvement in the operating efficiency of the electronic component cooling device 1.

As is seen above, an approximate heat loss from the electronic component E with which the current cooling ability is not excessive varies according to the current coolant temperature T and coolant flow rate V. Specifically, as the current coolant temperature T increases, the approximate heat loss from the electronic component E with which the cooling ability is not excessive is reduced, and as the current coolant flow rate V decreases, the approximate heat loss from the electronic component E with which the cooling ability is not excessive is reduced.

In other words, the approximate heat loss from the electronic component E with which the cooling ability is not excessive varies according to the coolant temperature T and the coolant flow rate V. Therefore, first, the coolant temperature T and the coolant flow rate V are used to calculate the lower limit threshold Q2 as the lower limit value of a reasonable heat loss with which excess of the cooling ability is avoided.

Note that the upper limit threshold Q1 and the lower limit threshold Q2 can be set based on the above-described concept; however, specific values thereof are set as appropriate. In other words, the setting value of the upper limit threshold Q1 may vary depending, for example, on how reliably the occurrence of dry-out is to be prevented. The lower limit threshold Q2 is set as appropriate depending, for example, on how much the operating efficiency of the cooling device is to be improved and moreover, how much cooling reliability for the electronic component E is to be improved.

Furthermore, the heat loss estimation unit 51 calculates the estimated heat loss Q in the electronic component E based on the electric current value I (refer to step S3).

Subsequently, the estimated heat loss Q is compared to each of the upper limit threshold Q1 and the lower limit threshold Q2 (refer to steps S4, S5). When the estimated heat loss Q is between the upper limit threshold Q1 and the lower limit threshold Q2, inclusive, that is, when $Q2 \leq Q \leq Q1$ is satisfied, the coolant flow rate is not changed.

In contrast, when the estimated heat loss Q is determined as exceeding the upper limit threshold Q1 in step S4, it is determined that dry-out may occur. Thus, in this case, the coolant flow rate control unit 53 increases the coolant flow rate (refer to step S6). For example, the output of the pump 112 is increased.

On the other hand, when the estimated heat loss Q is determined as being below the lower limit threshold Q2 in step S5, it is determined that the cooling device may exhibit over-engineering. Thus, in this case, the coolant flow rate control unit 53 decreases the coolant flow rate (refer to step S7). For example, the output of the pump 112 is reduced.

Note that the amounts of increase and decrease in the coolant flow rate in steps S6, S7 may be set as appropriate. Furthermore, these increase and decrease in the coolant flow rate may each be a preset amount. Alternatively, it is also conceivable to calculate appropriate amounts of increase and decrease from the relationship between Q and Q1, the relationship between Q and Q2, and the detection values of T, V, I, etc.

Note that in the present embodiment, the electronic component cooling device 1 may be mounted, for example, on an electric vehicle, a hybrid vehicle, etc. The electronic component E may be a structural part (for example, a semiconductor part) of an electric power conversion device. Furthermore, in the present embodiment, the coolant may be water, for example.

Next, the functions and effects of the present embodiment are described.

The electronic component cooling device 1 includes the heat loss estimation unit 51 and the loss threshold calculation unit 52. The heat loss estimation unit 51 estimates a heat loss from the electronic component E. The loss threshold calculation unit 52 calculates the upper limit threshold Q1 based on the coolant temperature T and the coolant flow rate V. Subsequently, when the estimated heat loss Q exceeds the upper limit threshold Q1, the coolant flow rate control unit 53 increases the flow rate of the coolant.

In other words, the flow rate of the coolant can be appropriately adjusted based on the heat loss from the electronic component E, the current coolant temperature T, and the current coolant flow rate V. As a result, the electronic component E can be efficiently cooled with ease. This means that the probability of the occurrence of dry-out at the current coolant flow rate V can be estimated based on, for example, the estimated heat loss Q in the electronic component E. The flow rate of the coolant can then be controlled based on the estimation. This enables efficient cooling of the electronic component E while preventing the occurrence of dry-out.

Furthermore, the loss threshold calculation unit 52 is configured to calculate the lower limit threshold Q2 of the heat loss from the electronic component E based on the coolant temperature T and the coolant flow rate V. When the estimated heat loss Q falls below the lower limit threshold Q2, the coolant flow rate control unit 53 decreases the flow rate of the coolant that circulates through the cooler 2. This allows a reduction in the occurrence of the coolant being supplied at an excessive flow rate as the cooling ability for the electronic component E. As a result, the operating efficiency of the electronic component cooling device 1 can be improved while sufficiently cooling the electronic component E.

As described above, in the present embodiment, using the coolant temperature T, the coolant flow rate V, and the electric current value I that have been detected, the coolant flow rate can be adjusted so that $Q2 \leq Q \leq Q1$ is satisfied. Consequently, the coolant flow rate can be reduced as much as possible within a range in which the occurrence of dry-out can be sufficiently prevented. As a result, the electronic component E can be efficiently cooled.

According to the present embodiment, an electronic component cooling device which easily enables efficient cooling of an electronic component can be provided as described above.

Second Embodiment

Figure 3:
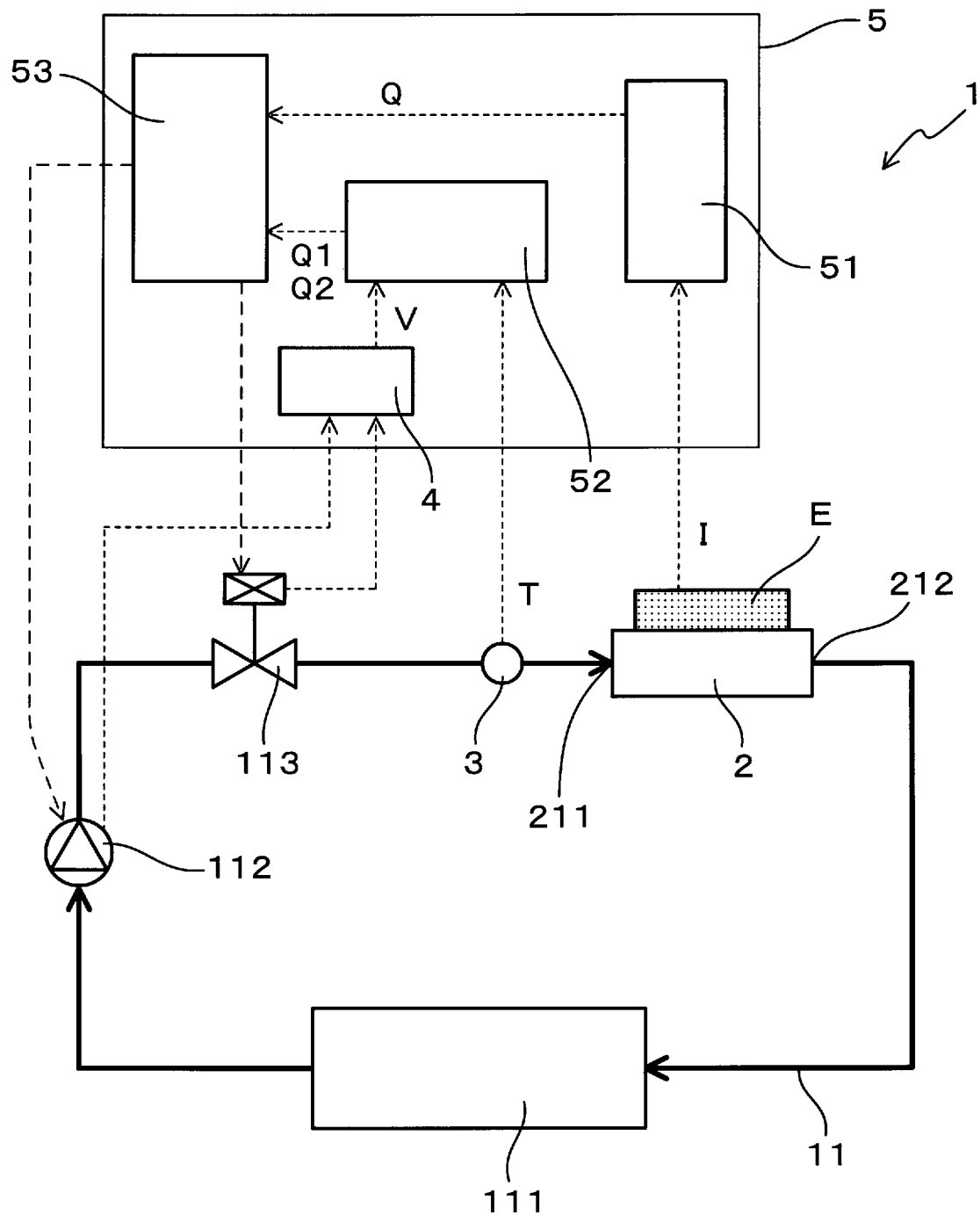
FIG. 3 conceptually illustrates an electronic component cooling device according to a second embodiment.

The present embodiment provides a valve 113 in the coolant circulation path 11, as illustrated in FIG. 3.

In the present embodiment, a solenoid valve is used as the valve 113.

The coolant flow rate acquisition unit 4 used in the present embodiment estimates a coolant flow rate from the opening of the valve 113. In this case, the coolant flow rate acquisition unit 4 may be provided, for example, inside the ECU 5, and may be configured to calculate the coolant flow rate V based on the opening of the valve 113. In other words, the coolant flow rate acquisition unit 4 used in the present embodiment indirectly acquires the coolant flow rate in the cooler 2.

Alternatively, the coolant flow rate acquisition unit 4 used herein may calculate a coolant flow rate from the output, the duty cycle, etc., of the pump 112. Alternatively, the coolant flow rate acquisition unit 4 may be configured to calculate the coolant flow rate V based on both the opening of the valve 113 and the output, etc., of the pump 112.

The coolant flow rate control unit 53 is configured to control the coolant flow rate in the cooler 2 by controlling the opening of the valve 113. Alternatively, the coolant flow rate control unit 53 may be configured to control the coolant flow rate by adjusting both the output of the pump 112 and the opening of the valve 113 as appropriate.

The other details are substantially the same as those in the first embodiment. Note that among reference signs used in the second embodiment and subsequent embodiments, reference signs that are the same as those used in the previously described embodiment represent structural elements, etc. that are substantially the same as those in the previously described embodiment unless otherwise noted.

In the present embodiment, since the coolant flow rate V is estimated using the opening of the valve 113, the flowmeter need not be provided. As a result, the electronic component cooling device 1 can be simplified.

Aside from this, substantially the same functions and effects as those in the first embodiment are produced.

Third Embodiment

Figure 4:
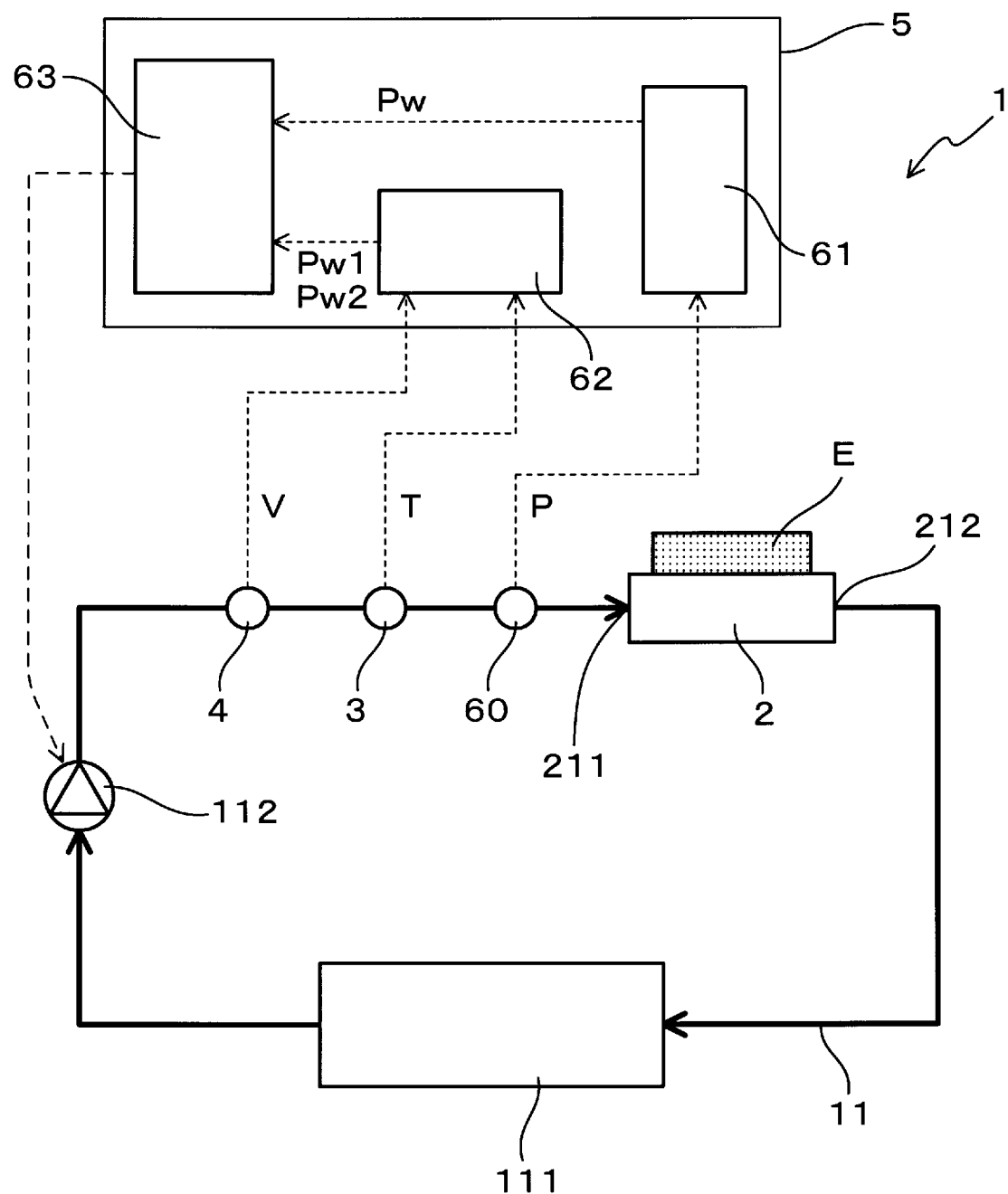
FIG. 4 conceptually illustrates an electronic component cooling device according to a third embodiment.
Figure 5:
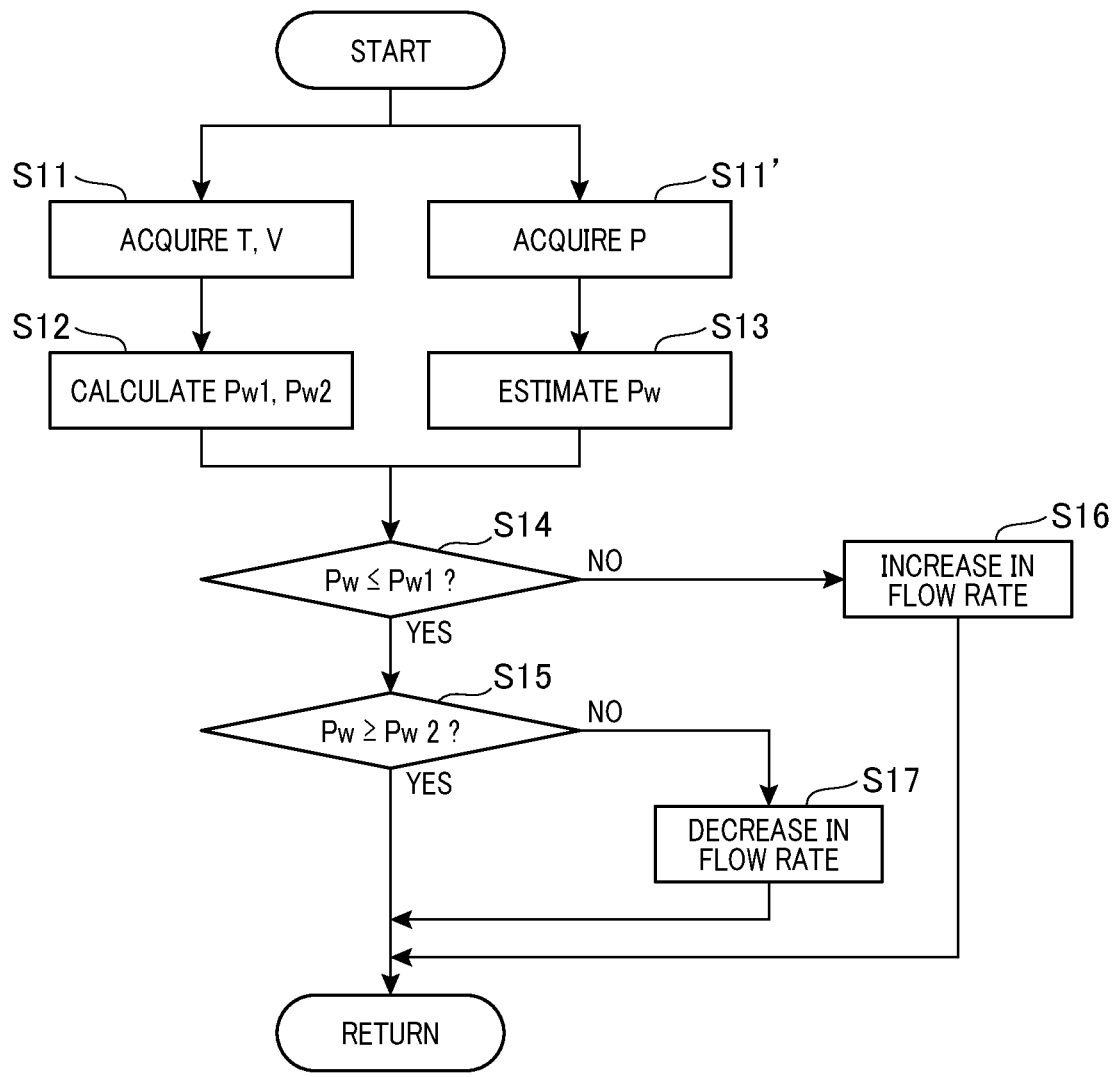
FIG. 5 is a flowchart of coolant control in the electronic component cooling device according to the third embodiment.

The present embodiment is an embodiment of the electronic component cooling device 1 configured to enable proper control of the coolant flow rate using an internal pressure amplitude that is the amplitude of the flow path internal pressure in the cooler 2, as illustrated in FIGS. 4 and 5.

As illustrated in FIG. 4, the electronic component cooling device 1 according to the present embodiment includes the cooler 2, the coolant temperature acquisition unit 3, the coolant flow rate acquisition unit 4, an internal pressure acquisition unit 60, an internal pressure amplitude calculation unit 61, an amplitude threshold calculation unit 62, and a coolant flow rate control unit 63. The cooler 2, the coolant temperature acquisition unit 3, and the coolant flow rate acquisition unit 4 are substantially the same as those described in the first embodiment.

The internal pressure acquisition unit 60 acquires a flow path internal pressure P in the cooler 2. The internal pressure amplitude calculation unit 61 calculates an internal pressure amplitude Pw. The internal pressure amplitude Pw is the amplitude of the flow path internal pressure P acquired by the internal pressure acquisition unit 60. The amplitude threshold calculation unit 62 calculates an upper limit threshold Pw1 of the internal pressure amplitude Pw based on the coolant temperature T acquired by the coolant temperature acquisition unit 3 and the coolant flow rate V acquired by the coolant flow rate acquisition unit 4. The coolant flow rate control unit 63 controls the flow rate of the coolant that circulates through the cooler 2.

The coolant flow rate control unit 63 is configured to, when the internal pressure amplitude Pw calculated by the internal pressure amplitude calculation unit 61 exceeds the upper limit threshold Pw1, increases the flow rate of the coolant that circulates through the cooler 2.

The amplitude threshold calculation unit 62 is configured to calculate a lower limit threshold Pw2 of the internal pressure amplitude Pw. The lower limit threshold Pw2 is calculated based on the coolant temperature T acquired by the coolant temperature acquisition unit 3 and the coolant flow rate V acquired by the coolant flow rate acquisition unit 4. The lower limit threshold Pw2 is less than the upper limit threshold Pw1.

The coolant flow rate control unit 63 is configured to, when the internal pressure amplitude Pw falls below the lower limit threshold Pw2, decreases the flow rate of the coolant that circulates through the cooler 2.

The internal pressure acquisition unit 60 may include a pressure sensor. The pressure sensor is provided between the pump 112 and the cooler 2 in the coolant circulation path 11. Thus, the pressure sensor can detect the flow path internal pressure in the cooler 2. Note that the pressure sensor may alternatively be provided in the cooler 2.

Next, with reference to the flowchart in FIG. 5, one example of a method for controlling the coolant flow rate in the electronic component cooling device 1 according to the present embodiment is described.

First, the temperature sensor serving as the coolant temperature acquisition unit 3, the flowmeter serving as the coolant flow rate acquisition unit 4, and moreover the pressure sensor serving as the internal pressure acquisition unit 60 acquire the coolant temperature T, the coolant flow rate V, and the flow path internal pressure P in the cooler 2, respectively (refer to steps S11, S11').

Next, the upper limit threshold Pw1 and the lower limit threshold Pw2 are calculated from the coolant temperature T and the coolant flow rate V (refer to step S12). Here, the upper limit threshold Pw1 can be set as an upper limit value of the internal pressure amplitude Pw of the coolant that is not considered to induce dry-out after predetermined time t1 even when the current coolant flow rate V is maintained. In other words, the upper limit threshold Pw1 can be set as a value that may lead to dry-out after the predetermined time t1 when the internal pressure amplitude exceeds this value if the current coolant flow rate V is maintained.

Specifically, the coolant begins to boil at a high temperature, but this boiling state gradually changes until dry-out occurs. This boiling state can be assessed according to how the flow path internal pressure P in the cooler 2 oscillates. This means that in the state where the coolant is not boiling, the flow path internal pressure P does not oscillate, and the internal pressure amplitude Pw is approximately zero. However, when the coolant begins to boil, the flow path internal pressure P begins to oscillate, and the internal pressure amplitude Pw gradually increases. Therefore, the occurrence of dry-out can be predicted based on the internal pressure amplitude Pw which gradually increases in a non-boiling state until dry-out occurs.

The lower limit threshold Pw2 can be set as an upper limit value of the internal pressure amplitude Pw of the coolant that is not considered to induce dry-out after predetermined time t2 even when the current coolant flow rate V is maintained. Here, the predetermined time t2 is longer than the predetermined time t1 described above. In other words, the lower limit threshold Pw2 can be regarded as an upper limit value of the internal pressure amplitude Pw indicating the boiling state of the coolant with a relatively sufficient buffer before dry-out occurs.

The boiling state of the coolant transitions from the non-boiling state to a nucleate boiling state, a transition boiling state, and a film boiling state in sequence. Dry-out occurs in the transition boiling state and the film boiling state, but does not occur in the nucleate boiling state. More specifically, in the nucleate boiling state, heat is likely to move from the electronic component E to the coolant. Therefore, maintaining the nucleate boiling state enables more efficient cooling.

Accordingly, the coolant flow rate is desirably adjusted to maintain the nucleate boiling state while preventing dry-out. Thus, the coolant flow rate is desirably controlled so that the flow path internal pressure P oscillates with a rather small internal pressure amplitude as described above. The lower limit threshold Pw2 can be set as a lower limit value of the range of the internal pressure amplitude Pw indicating such a proper boiling state of the coolant.

Not that the upper limit threshold Pw1 and the lower limit threshold Pw2 can be set based on the above-described concept; however, specific values thereof are set as appropriate. In other words, the setting value of the upper limit threshold Pw1 may vary depending, for example, on how reliably the occurrence of dry-out is to be prevented. The setting value of the lower limit threshold Pw2 may vary depending, for example, on the extent of use of the cooling effects produced by nucleate boiling.

Furthermore, in step S13 in FIG. 5, the internal pressure amplitude calculation unit 61 calculates the internal pressure amplitude Pw. In other words, the internal pressure amplitude Pw is calculated based on very short period fluctuations in the flow path internal pressure P measured by the pressure sensor.

Subsequently, the internal pressure amplitude Pw is compared to each of the upper limit threshold Pw1 and the lower limit threshold Pw2 (refer to steps S14, S15). When the internal pressure amplitude Pw is between the upper limit threshold Pw1 and the lower limit threshold Pw2, inclusive, that is, when Pw2≤Pw≤Pw1 is satisfied, the coolant flow rate is not changed.

In contrast, when the internal pressure amplitude Pw is determined as exceeding the upper limit threshold Pw1 in step S14, dry-out may occur after the predetermined time t1. Thus, in this case, the coolant flow rate control unit 63 increases the coolant flow rate (refer to step S16). For example, the output of the pump 112 is increased.

On the other hand, when the internal pressure amplitude Pw is determined as being below the lower limit threshold Pw2 in step S15, there is a sufficient buffer before dry-out occurs, and in addition, there is a possibility that the high cooling performance of the coolant in the nucleate boiling state may not be sufficiently exhibited. Thus, in this case, the coolant flow rate control unit 63 decreases the coolant flow rate (refer to step S17). For example, the output of the pump 112 is reduced.

Note that the amounts of increase and decrease in the coolant flow rate in steps S16, S17 may be set as appropriate. Furthermore, these increases and decreases in the coolant flow rate may each be a preset amount. Alternatively, it is also conceivable to calculate appropriate amounts of increase and decrease from the relationship between the internal pressure amplitude Pw and the upper limit threshold Pw1, the relationship between the internal pressure amplitude Pw and the lower limit threshold Pw2, and the measurement values of the coolant temperature T, the coolant flow rave V, the internal pressure amplitude Pw, etc.

The other details are substantially the same as those in the first embodiment.

Next, the functions and effects of the present embodiment are described.

The electronic component cooling device 1 includes the internal pressure amplitude calculation unit 61 and the amplitude threshold calculation unit 62. The internal pressure amplitude calculation unit 61 calculates an internal pressure amplitude Pw. The amplitude threshold calculation unit 62 calculates the upper limit threshold Pw1 of the internal pressure amplitude Pw based on the coolant temperature T and the coolant flow rate V. When the internal pressure amplitude Pw exceeds the upper limit threshold Pw1, the coolant flow rate control unit 63 increases the flow rate of the coolant.

In other words, the flow rate of the coolant can be appropriately adjusted based on the current internal pressure amplitude Pw, the current coolant temperature T, and the current coolant flow rate V. As a result, the electronic component E can be efficiently cooled with ease. This means that the probability of the occurrence of dry-out at the current coolant flow rate V after the predetermined time t1 can be estimated based on the internal pressure amplitude Pw, etc. The flow rate of the coolant can then be controlled based on the estimation. This enables efficient cooling of the electronic component E while preventing the occurrence of dry-out.

Furthermore, the amplitude threshold calculation unit 62 is configured to calculate the lower limit threshold Pw2 of the internal pressure amplitude Pw based on the coolant temperature T and the coolant flow rate V. The coolant flow rate control unit 63 is configured to, when the internal pressure amplitude Pw falls below the lower limit threshold Pw2, decreases the flow rate of the coolant that circulates through the cooler 2. This can lead to a reduction in the occurrence of an excessive amount of the coolant being supplied, allowing improvement in the operating efficiency of the electronic component cooling device 1. Furthermore, the reduction in the coolant flow rate can also lead to improvement in the cooling efficiency as a result of an increase in the cooling ability using the nucleate boiling state.

According to the present embodiment, an electronic component cooling device which easily enables efficient cooling of an electronic component can be provided as described above. Aside from this, substantially the same functions and effects as those in the first embodiment are produced.

Fourth Embodiment

Figure 6:
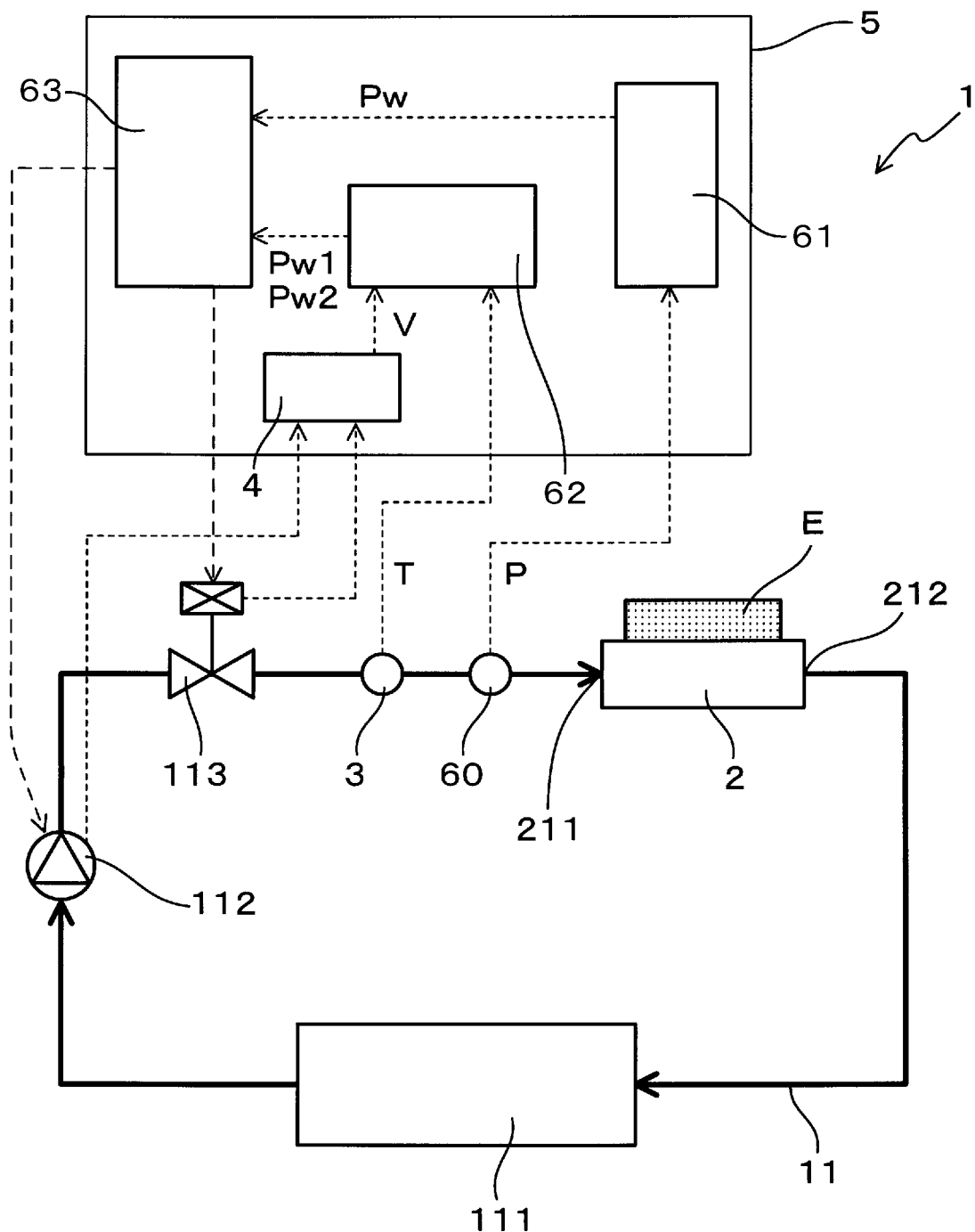
FIG. 6 conceptually illustrates an electronic component cooling device according to a fourth embodiment.

The present embodiment provides a valve 113 in the coolant circulation path 11, as illustrated in FIG. 6.

In the present embodiment, a solenoid valve is used as the valve 113. The valve 113 is disposed downstream of the pump 112 and upstream of the internal pressure acquisition unit 60 in the coolant circulation path 11.

As in the second embodiment, the coolant flow rate acquisition unit 4 used herein estimates the coolant flow rate V from the opening of the valve 113. Alternatively, the coolant flow rate acquisition unit 4 used herein may calculate the coolant flow rate from the output, the duty cycle, etc., of the pump 112. Alternatively, the coolant flow rate acquisition unit 4 may be configured to calculate the coolant flow rate V based on both the opening of the valve 113 and the output, etc., of the pump 112.

The coolant flow rate control unit 63 is configured to control the coolant flow rate in the cooler 2 by controlling the opening of the valve 113. Alternatively, the coolant flow rate control unit 63 may be configured to control the coolant flow rate by adjusting both the output of the pump 112 and the opening of the valve 113 as appropriate. The other details are substantially the same as those in the first embodiment.

In the present embodiment, since the coolant flow rate V is estimated using the opening of the valve 113, the flowmeter need not be provided. As a result, the electronic component cooling device 1 can be simplified.

Aside from this, substantially the same functions and effects as those in the third embodiment are produced.

Fifth Embodiment

Figure 7:
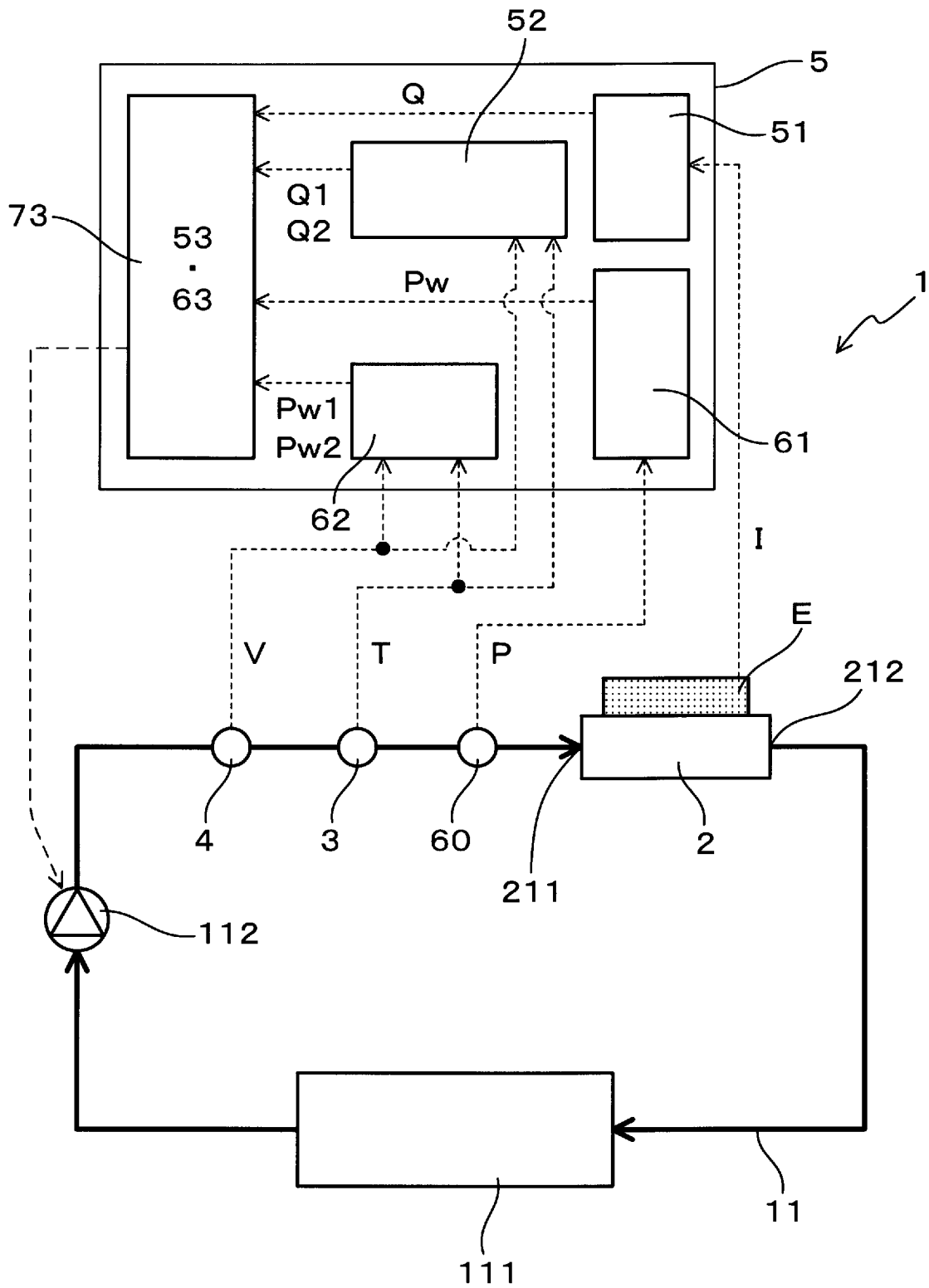
FIG. 7 conceptually illustrates an electronic component cooling device according to a fifth embodiment.
Figure 8:
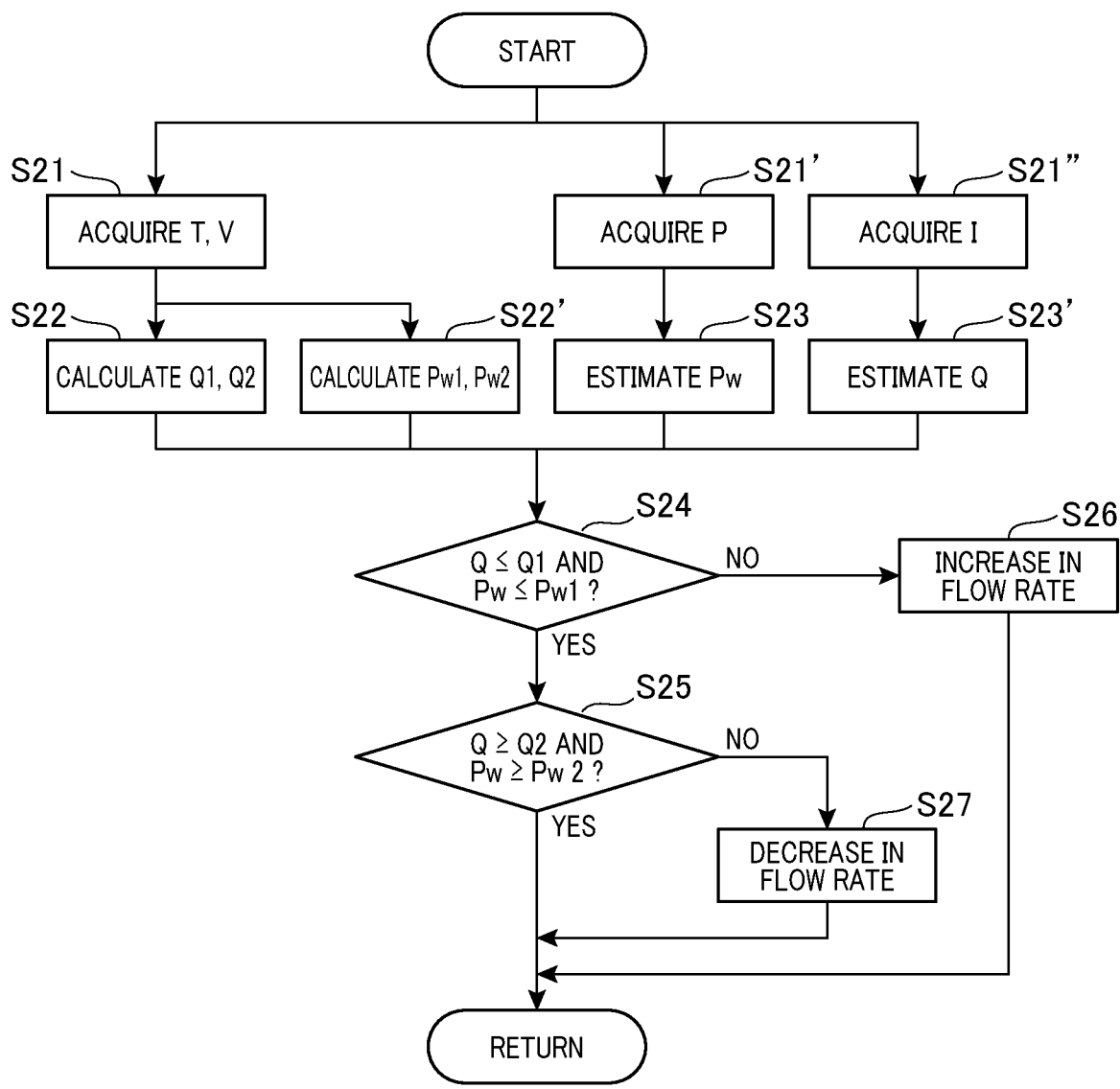
FIG. 8 is a flowchart of coolant control in the electronic component cooling device according to the fifth embodiment.

The present embodiment results from combining the first and second embodiments, as illustrated in FIGS. 7 and 8.

Specifically, in the present embodiment, the coolant flow rate is controlled using both the estimated heat loss Q and the internal pressure amplitude Pw.

As illustrated in FIG. 7, the electronic component cooling device 1 according to the present embodiment includes the cooler 2, the coolant temperature acquisition unit 3, the coolant flow rate acquisition unit 4, the internal pressure acquisition unit 60, the internal pressure amplitude calculation unit 61, the amplitude threshold calculation unit 62, the heat loss estimation unit 51, the loss threshold calculation unit 52, and a coolant flow rate control unit 73. These structural elements are substantially the same as those described in the first or third embodiment. Note that the coolant flow rate control unit 73 has both the function described in the first embodiment and the function described in the third embodiment.

A method for controlling the coolant flow rate in the electronic component cooling device 1 according to the present embodiment is descried with reference to FIG. 8.

First, the coolant temperature T, the coolant flow rate V, the electric current value I of the electric current flowing to the electronic component E, and the flow path internal pressure P are acquired (refer to steps S21, S21', and S21").

Next, the upper limit threshold Q1 and the lower limit threshold Q2 of the heat loss and furthermore the upper limit threshold Pw1 and the lower limit threshold Pw2 of the internal pressure amplitude of the flow path internal pressure are calculated from the coolant temperature T and the coolant flow rate V (refer to steps S22, S22').

Furthermore, the heat loss estimation unit 51 calculates the estimated heat loss Q in the electronic component E based on the electric current value I, and the internal pressure amplitude calculation unit 61 calculates the internal pressure amplitude Pw based on the flow path internal pressure P (refer to steps S23, S23').

Subsequently, in step S24, the estimated heat loss Q and the upper limit threshold Q1 of the heat loss are compared, and the internal pressure amplitude Pw and the upper limit threshold Pw1 of the internal pressure amplitude are compared. When both "Q≤Q1" and "Pw≤Pw1" are satisfied, the processing proceeds to step S25. On the other hand, when at least one of "Q≤Q1" and "Pw≤Pw1" is not satisfied, the coolant flow rate is increased (refer to step S26). In other words, when the estimated heat loss Q exceeds the upper limit threshold Q1 or when the internal pressure amplitude Pw exceeds the upper limit threshold Pw1, it is determined that dry-out may occur, and the coolant flow rate is increased.

Subsequently, in step S25, the estimated heat loss Q and the lower limit threshold Q2 of the heat loss are compared, and the internal pressure amplitude Pw and the lower limit threshold Pw2 of the internal pressure amplitude are compared. When both "Q≥Q2" and "Pw≥Pw2" are satisfied, the coolant flow rate is not changed. On the other hand, when at least one of "Q≥Q2" and "Pw≥Pw2" is not satisfied, the coolant flow rate is decreased (refer to step S27). This means that when the estimated heat loss Q is below the lower limit threshold Q2 or when the internal pressure amplitude Pw is below the lower limit threshold Pw2, it is determined that the cooling ability may be excessive or the cooling efficiency may be reduced, and the coolant flow rate is decreased.

The other details are substantially the same as those in the first or third embodiment.

As described above, in the electronic component cooling device 1 according to the present embodiment, when one of the condition for increasing the coolant flow rate described in the first embodiment and the condition for increasing the coolant flow rate described in the third embodiment is satisfied, the coolant flow rate is increased. Therefore, the occurrence of dry-out can be more reliably prevented.

Furthermore, in the electronic component cooling device 1 according to the present embodiment, when one of the condition for decreasing the coolant flow rate described in the first embodiment and the condition for decreasing the coolant flow rate described in the third embodiment is satisfied, the coolant flow rate is decreased. Therefore, the operating efficiency of the electronic component cooling device 1 can be further improved.

Aside from this, substantially the same functions and effects as those in the first or third embodiment are produced.

Note that the present embodiment may be partially modified, for example, as follows. Specifically, in a modified embodiment, when one of "Q≥Q2" and "Pw≥Pw2" is satisfied in step S25 in FIG. 6, the coolant flow rate may be determined not to be changed. In an alternative embodiment, only whether "Q≥Q2" is satisfied or only whether "Pw≥Pw2" is satisfied can be determined in step S25.

Sixth Embodiment

The present embodiment is an embodiment of an electronic component cooling device 10 in which a coolant flow path 22 in a cooling pipe 20 has a central flow path 221 and an outer flow path 222 such as those described below, as illustrated in FIGS. 9 to 12.

Figure 9:
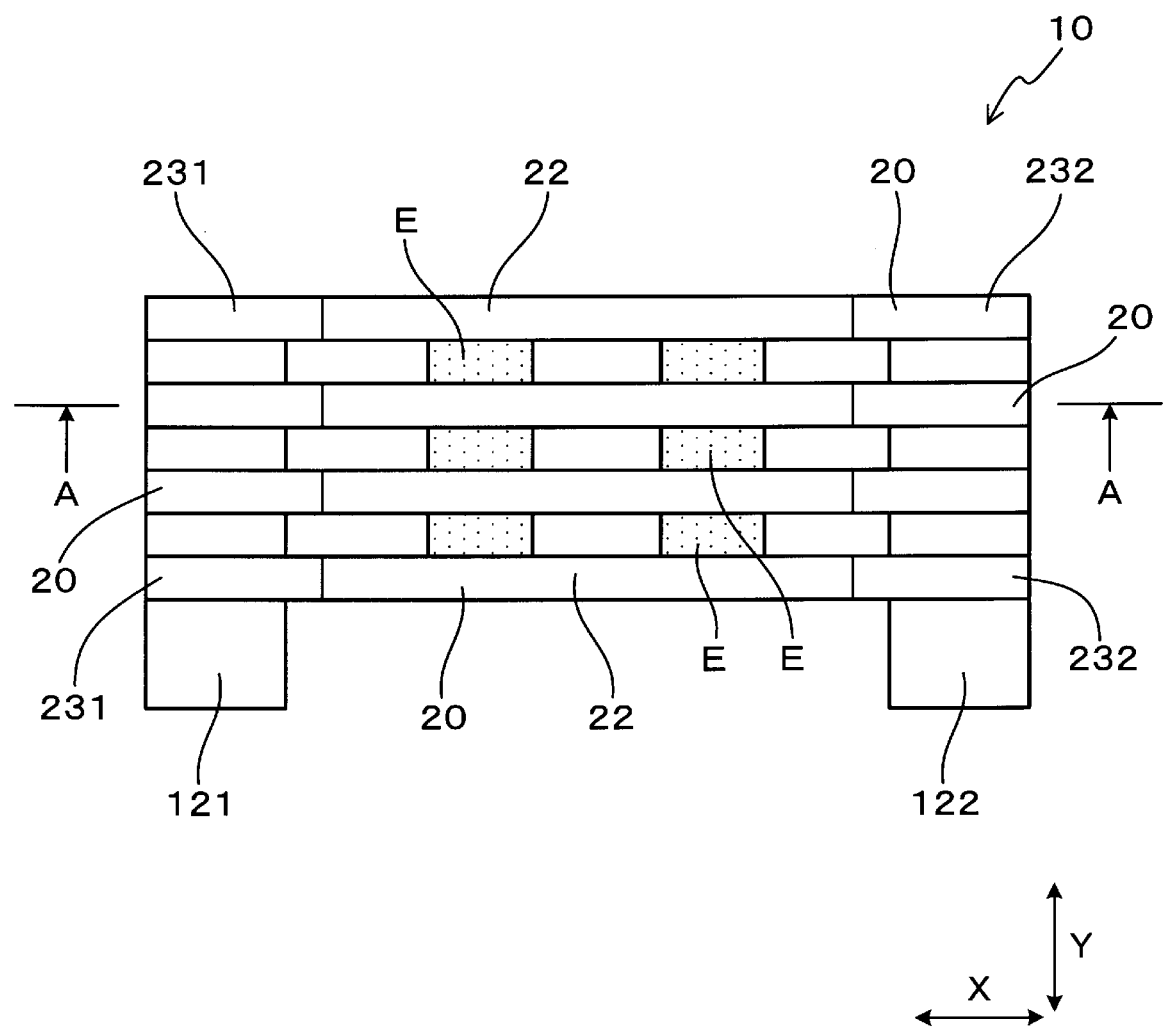
FIG. 9 is a diagram for describing an electronic component cooling device according to a sixth embodiment.

The electronic component cooling device 10 according to the present embodiment is a cooling device that cools the electronic component E. As illustrated in FIG. 9, the electronic component cooling device 10 includes the cooling pipe 20 that thermally contacts the electronic component E.

Figure 10:
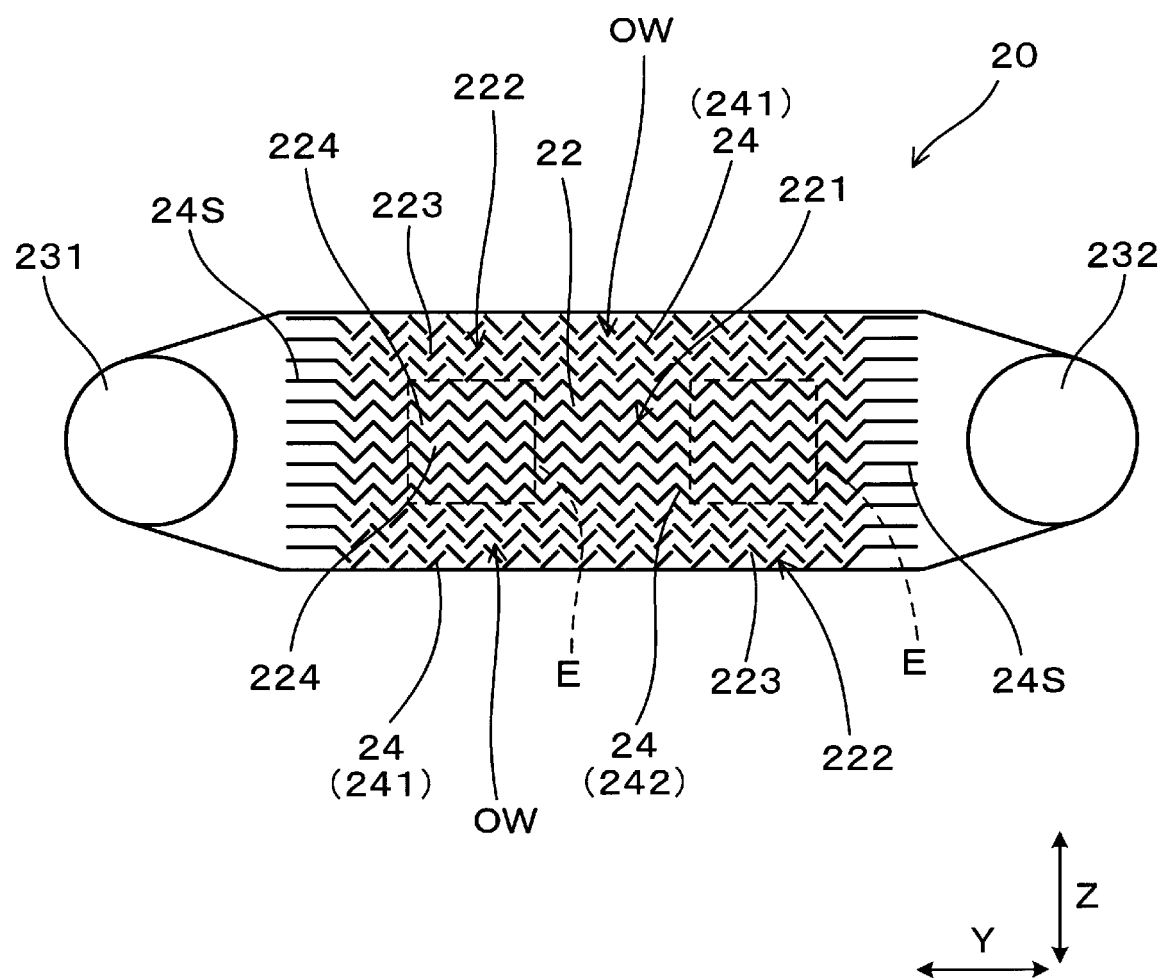
FIG. 10 is a cross-sectional view for describing a cooling pipe according to the sixth embodiment that corresponds to a cross-section taken along line A-A in FIG. 9.

As illustrated in FIG. 10, the cooling pipe 20 includes a coolant flow path 22 through which the coolant circulates, a coolant inlet 231 which is an entry for the coolant into the coolant flow path 22, and a coolant outlet 232 which is an exit for the coolant from the coolant flow path.

An inner fin 24 is provided in the coolant flow path 22.

A direction orthogonal to both a stacking direction X of the cooling pipe 20 and the electronic component E and an alignment direction Y of the coolant inlet 231 and the coolant outlet 232 is defined as a width direction Z. At both outer portions of the coolant flow path in a width direction Z and at a central portion of the coolant flow path in the width direction Z between the both outer portions, outer flow paths 222 and a central flow path 221 each including the inner fin 24 that is formed in a different pattern are formed, respectively.

Figure 11:
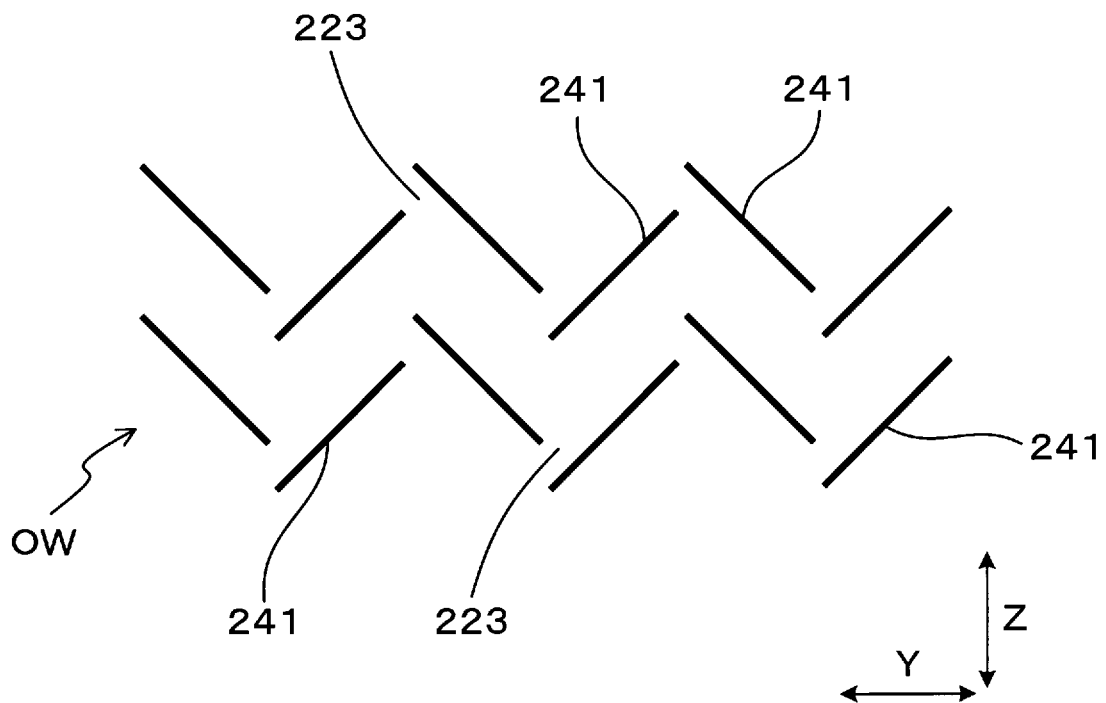
FIG. 11 is a diagram for describing an offset wave pattern according to the sixth embodiment.

As illustrated in FIGS. 10 and 11, an inner fin 24 in the outer flow path 222 includes a plurality of angled portions 241 disposed in alternating directions with respect to the alignment direction Y when viewed from the stacking direction X. In addition, a communication path 223 which opens in the width direction Z is formed between the angled portions 241 adjacent to each other in the alignment direction Y. Note that the formation pattern of the inner fin 24 will be hereinafter referred to also as an offset wave pattern OW, as appropriate.

The flow path resistance of the central flow path 221 is less than the flow path resistance of the outer flow path 222. Hereinafter, the stacking direction X will be referred to simply as the X-direction, the alignment direction Y will be referred to simply as the Y-direction, and the width direction will be referred to simply as the Z-direction, as appropriate.

In the present embodiment, the electronic component cooling device 10 can be acquired by stacking the plurality of cooling pipes 20 in the X-direction, as illustrated in FIG. 9. The respective coolant inlets 231 of the cooling pipes 20 adjacent to each other in the X-direction are connected to each other, and the respective coolant outlets 232 of the cooling pipes 20 adjacent to each other in the X-direction are connected to each other. The electronic component E is disposed between the cooling pipes 20 adjacent to each other in the X-direction. The electronic component E is sandwiched between a pair of cooling pipes 20 in the X-direction. This allows the electronic component E to be cooled on both surfaces in the X-direction by the cooling pipes 20. Note that in the present embodiment, two electronic components E are arranged side by side in the Y-direction, between a pair of cooling pipes 20.

An inlet port 121 for introducing the coolant and an outlet port 122 for discharging the coolant are provided in the cooling pipe 20 disposed at one end of the electronic component cooling device 10 in the X-direction. The cooling pipe 20 is formed from a highly thermally-conductive metal such as aluminum. The inner fin 24 is also formed from a highly thermally-conductive metal such as aluminum.

As illustrated in FIG. 10, the central flow path 221 of the coolant flow path 22 overlaps the electronic component E when viewed from the X-direction. An approximately entire region of the central flow path 221 in the Z-direction overlaps the electronic component E. The most part of the outer flow path 222 of the coolant flow path 22 does not overlap the electronic component E when viewed from the X-direction. Note that the electronic component E means, for example, a portion from which the cooling pipe 20 receives heat, such as a semiconductor element, and, for example, when a semiconductor element or the like is molded in resin, a resin portion is not included in the electronic component E. Furthermore, for example, in the case of a semiconductor module or the like formed by integrating a plurality of semiconductor elements or the like in a resin portion, the electronic component E does not mean the semiconductor module, but means individual semiconductor elements or the like provided in the semiconductor module.

Figure 12:
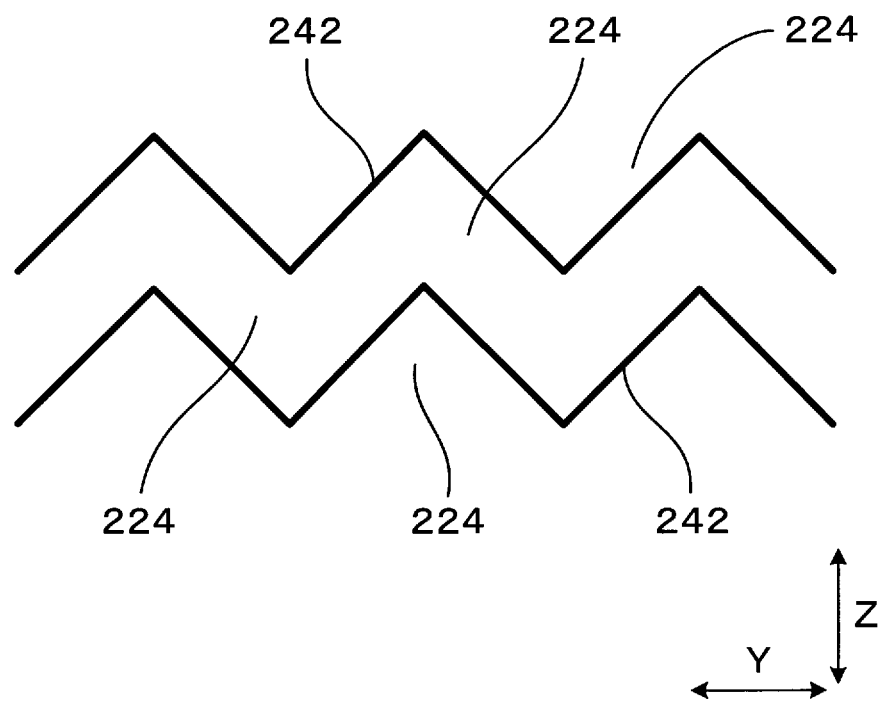
FIG. 12 is a diagram for describing a continuous inner fin and a branch flow path according to the sixth embodiment.

The central flow path 221 includes a continuous inner fin 242. The continuous inner fin 242 is the inner fin 24 that is continuously formed between the upstream side of the electronic component E and the downstream side of the electronic component E in the Y-direction, as illustrated in FIGS. 10 and 12. A plurality of branch flow paths 224 separated from each other by the continuous inner fin 242 are continuous without merging with each other between the upstream side of the electronic component E and the downstream side of the electronic component E.

In the present embodiment, a plurality of electronic components E are aligned in the Y-direction. In such a case, being on the upstream side of the electronic component E means being on the upstream side of all the electronic components E aligned in the Y-direction. Similarly, being on the downstream side of the electronic component E means being on the downstream side of all the electronic components E aligned in the Y-direction.

In the central flow path 221, the plurality of continuous inner fins 242 are disposed in parallel. The continuous inner fins 242 adjacent to each other in the Z-direction are formed substantially parallel to each other. Each of the continuous inner fins 242 is a wave fin having an approximate wave shape when viewed from the X-direction. The plurality of continuous inner fins 242 are positioned so that peaks of this wave shape overlap each other in the Z-direction and valleys of this wave shape overlap each other in the Z-direction.

Thus, the branch flow path 224 having an approximate wave shape is formed between the continuous inner fins 242. Note that at each of the upstream end and the downstream end of the continuous inner fin 242, a straight portion 24S substantially parallel to the Y-direction is formed. In the present embodiment, two electronic components E are disposed between the downstream end of the straight portion 24S located on the side and the upstream end of the straight portion 24S located on the downstream side when viewed from the X-direction.

In the outer flow path 222, the offset wave pattern OW is formed as described above. Specifically, the plurality of angled portions 241 are formed in the outer flow path 222 as the inner fin 24. Furthermore, the straight portions 24S of the inner fin 24 are formed on both the upstream side and the downstream side of the outer flow path 222. The inner fin 24 in the outer flow path 222 except the straight portion 24S has the offset wave pattern OW.

As illustrated in FIG. 11, a large number of angled portions 241 in the offset wave pattern OW are sloped with respect to the Y-direction.

Furthermore, the slopes of the angled portions 241 adjacent to each other in the Y-direction are oriented in different directions with respect to the Y-direction. In the present embodiment, the angled portion 241 is sloped, for example, at approximately 30 to 60 degrees with respect to the Y-direction when viewed from the X-direction. Note that a part of the plurality of angled portions 241 is sloped to one side with respect to the Y-direction, and the other part of the plurality of angled portions 241 is sloped to the other side with respect to the Y-direction. Furthermore, the slopes of the angled portions 241 adjacent to each other in the Y-direction are oriented in opposite directions with respect to the Y-direction.

The plurality of angled portions 241 are arranged also in the Z-direction. The slopes of the plurality of angled portions 241 arranged in the width direction Z are oriented in the same direction with respect to the Y-direction.

Note that the wording "the slopes are oriented in opposite directions with respect to the Y-direction" means that the slopes are directed from one side to the other side along the Y-direction so as to extend on the opposite sides along the Z-direction when viewed from the X-direction. The wording "the slopes are oriented in the same direction with respect to the Y-direction" means that the slopes are directed from one side to the other side along the Y-direction so as to extend on the same side along the Z-direction when viewed from the X-direction.

In the present embodiment, each of the angled portions 241 is formed in a substantially straight line when viewed from the X-direction. The angled portions 241 adjacent to each other in the Y-direction are located so that a virtual extension line extending on the downstream side from the angled portion 241 located on the upstream side intersects with the angled portion 241 located on the downstream side.

In the outer flow path 222, since the inner fin 24 is formed by arranging the plurality of angled portions 241 in the aforementioned state, the flow path resistance for the coolant that flows therebetween is likely to increase. In other words, the flow path resistance of the outer flow path 222 for the coolant is greater than that of the central flow path 221 in which the branch flow path 224 is formed between the continuous inner fins 242.

Note that in the present embodiment, the electronic component cooling device 10 may be mounted, for example, on an electric vehicle, a hybrid vehicle, etc. The electronic component E may be a structural part (for example, a semiconductor part) of an electric power conversion device. Furthermore, in the present embodiment, the coolant may be water, for example.

Next, the functions and effects of the present embodiment are described.

In the electronic component cooling device 10 described above, the flow path resistance of the central flow path 221 is less than the flow path resistance of the outer flow path 222. This allows an increase in the coolant flow rate in the central flow path 221. Thus, a localized increase in the coolant temperature is suppressed, allowing for efficient cooling of the electronic component E.

Specifically, the coolant introduced from the coolant inlet 231 flows into the central flow path 221 and the outer flow path 222 as well. However, a larger amount of the coolant flows to an area having less flow path resistance. Accordingly, a larger amount of the coolant flows in the central flow path 221 having relatively less flow path resistance than in the outer flow path 222. Thus, the flow rate of the coolant in the central flow path 221 can be increased without increasing the total flow rate of the coolant. Consequently, the flow rate of the coolant in the central flow path 221 can be increased, for example, without increasing the output of a pump that feeds the coolant. As a result, efficient cooling of the electronic component E is facilitated.

In particular, the occurrence of dry-out of the coolant in the coolant flow path 22 can be effectively reduced. Specifically, in the coolant flow path 22, a portion that mainly receives heat from the electronic component E is the coolant present in the central flow path 221. Because the flow rate of this coolant can be increased as mentioned above, evaporation of said coolant can be reduced. As a result, the occurrence of dry-out can be reduced. This allows a reduction in cooling performance deterioration.

Furthermore, the total amount of coolant supplied can be cut back accordingly. As a result, the operating efficiency of the electronic component cooling device 10 can be improved as a whole.

The central flow path 221 has the continuous inner fin 242. The plurality of branch flow paths 224 are continuous without merging with each other between the upstream side of the electronic component E and the downstream side of the electronic component E. This allows the flow path resistance of the central flow path 221 to be effectively reduced. As a result, the flow rate of the coolant in the central flow path 221 can be easily increased.

That is, the flow path resistance of the central flow path 221 is less than the flow path resistance of each of the outer flow paths. This allows an increase in the coolant flow rate in the central flow path. Thus, a localized increase in the coolant temperature is suppressed, allowing for efficient cooling of the electronic component.

According to the present embodiment, an electronic component cooling device which easily enables efficient cooling of an electronic component can be provided as described above.

Seventh Embodiment

Figure 13:
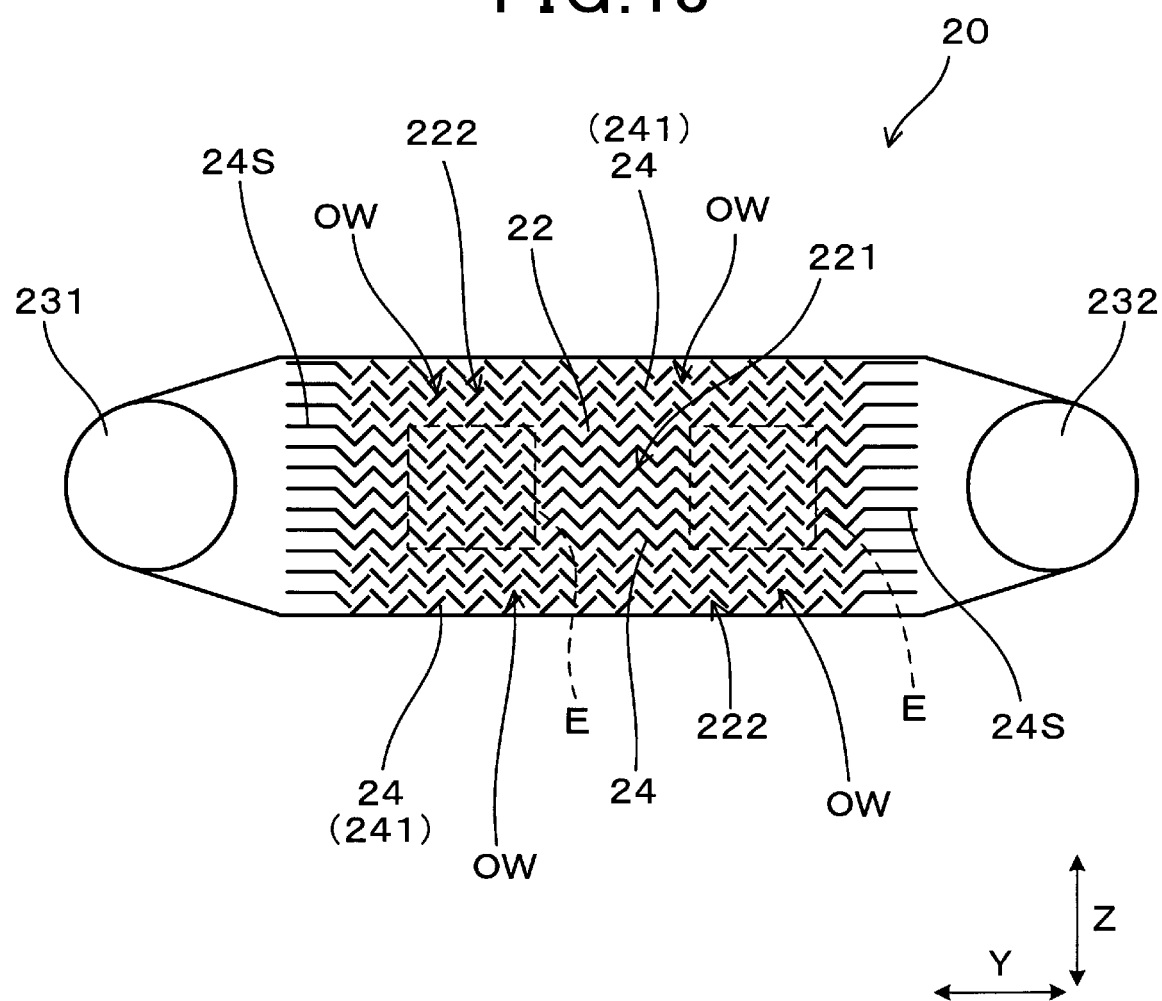
FIG. 13 is a cross-sectional view for describing a cooling pipe according to a seventh embodiment.

The present embodiment results from modifying the formation pattern of the inner fin 24 in a part of the central flow path 221 to the offset wave pattern OW as illustrated in FIG. 13.

Specifically, in the central flow path 221, a portion overlapping the electronic component E when viewed from the X-direction has the offset wave pattern OW. Furthermore, in the central flow path 221, the communication path 223 is not formed in a portion not overlapping the electronic component E when viewed from the X-direction.

The formation pattern of the inner fin 24 in the outer flow path 222 is substantially the same as that in the sixth embodiment.

The other details are substantially the same as those in the sixth embodiment.

In the present embodiment, a portion overlapping the electronic component E when viewed from the X-direction has the offset wave pattern OW. This results in an increase in the area of contact between the coolant and the inner fin 24 as well as an increase in collision of the coolant with the inner fin 24 in the portion overlapping electronic component E. Thus, the efficiency of heat exchange between the electronic component E and the coolant can be improved.

Furthermore, as a result of forming the offset wave pattern OW in a region overlapping the electronic component E, that is, a region that can easily receive heat from the electronic component E, an evaporated coolant more easily moves in the Z-direction through the communication path 223. This reduces the occurrence of dry-out in the coolant flow path 22 and facilitates flowing of the liquid coolant into the central flow path 221. As a result, the cooling performance in the central flow path 221 can be improved.

Aside from this, substantially the same functions and effects as those in the sixth embodiment are produced.

Eighth Embodiment

Figure 14:
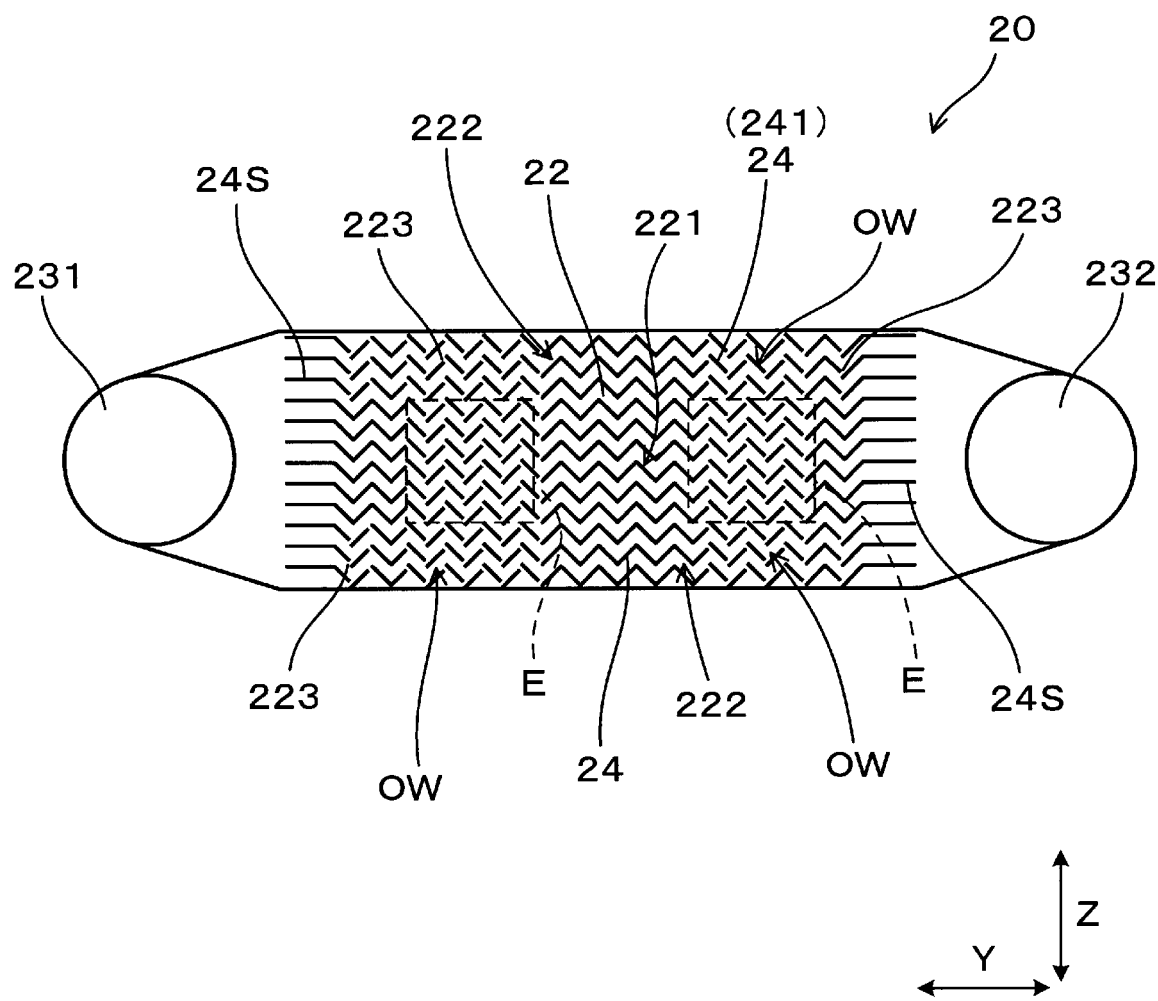
FIG. 14 is a cross-sectional view for describing a cooling pipe according to an eighth embodiment.

The present embodiment results from forming the offset wave pattern OW in a part of the outer flow path 222 only, as illustrated in FIG. 14.

In the present embodiment, the offset wave pattern OW is formed in a region overlapping the electronic component E in the Y-direction. Furthermore, each of the outer flow path 222 and the central flow path 221 includes a portion in which no communication path 223 is provided between the angled portions 241 adjacent to each other in the Y-direction. In the present embodiment, no communication path 223 is formed across the entire coolant flow path 22 in the Z-direction, in the region between two electrode components E in the Y-direction.

In a part of the outer flow path 222, the communication path 223 is formed on the upstream side of the electronic component E located on the upstream side and on the downstream side of the electronic component E located on the downstream side. On the other hand, in the central flow path 221, no communication path 223 is formed on the upstream side of the electronic component E located on the upstream side or on the downstream side of the electronic component E located on the downstream side. This makes the flow path resistance of the central flow path 221 less than the flow path resistance of the outer flow path 222.

The other details are substantially the same as those in the seventh embodiment.

In the present embodiment, when the coolant is evaporated in a region of the coolant flow path 22 that overlaps the electronic component E, coolant vapor is allowed to escape to the outer flow path 222. Thus, even if the coolant is evaporated, the occurrence of dry-out can be reduced. Furthermore, flowing of the liquid coolant into the central flow path 221 is further facilitated. As a result, the cooling performance in the central flow path 221 can be improved.

Aside from this, substantially the same functions and effects as those in the seventh embodiment are produced.

Ninth Embodiment

Figure 15:
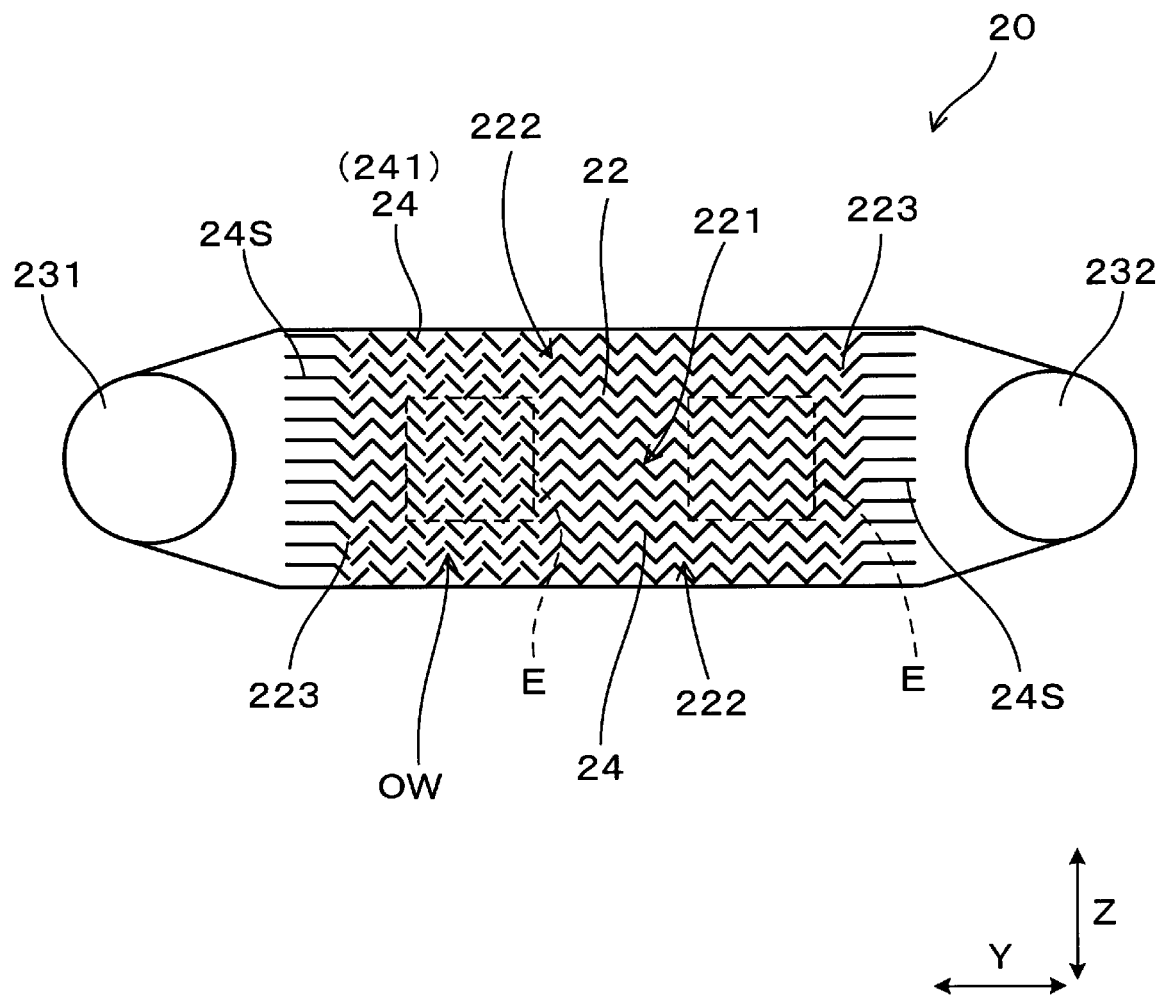
FIG. 15 is a cross-sectional view for describing a cooling pipe according to a ninth embodiment.

The present embodiment results from forming the offset wave pattern OW in a region overlapping the electronic component E located on the upstream side in the Y-direction and not forming the offset wave pattern OW in a region overlapping the electronic component E located on the downstream side in the Y-direction, as illustrated in FIG. 15.

The other details are substantially the same as those in the eighth embodiment.

In the present embodiment, particularly in the case where the electronic component E located on the upstream side is more likely to generate heat, the cooling efficiency can be easily improved and dry-out can be easily reduced.

Aside from this, substantially the same functions and effects as those in the eighth embodiment are produced.

Tenth Embodiment

Figure 16:
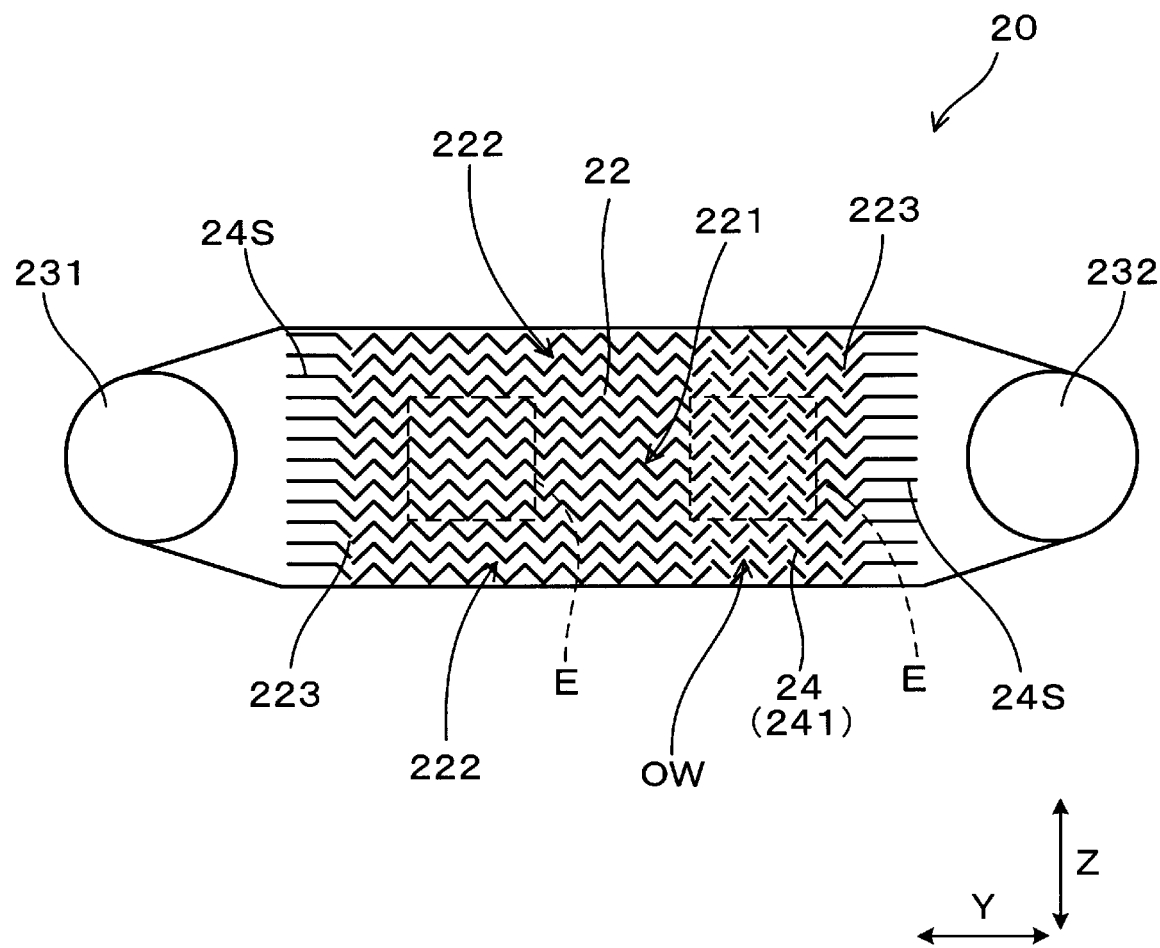
FIG. 16 is a cross-sectional view for describing a cooling pipe according to a tenth embodiment.

The present embodiment results from, opposite of the case in the ninth embodiment, forming the offset wave pattern OW in a region overlapping the electronic component E located on the downstream side in the Y-direction and not forming the offset wave pattern OW in a region overlapping the electronic component E located on the upstream side in the Y-direction, as illustrated in FIG. 16.

The other details are substantially the same as those in the eighth embodiment.

In the present embodiment, the offset wave pattern OW is formed in a region overlapping the electronic component E located on the upstream side in the Y-direction. In the case where two electronic components E are arranged side by side in the Y-direction, a high-temperature coolant resulting from receiving heat on the upstream side further receives heat on the downstream side. Therefore, the downstream side is generally more susceptible to evaporation. Thus, forming the offset wave pattern OW in the downstream region effectively reduces the occurrence of dry-out and effectively facilitates flowing of the coolant into the central flow path 221.

Aside from this, substantially the same functions and effects as those in the eighth embodiment are produced.

In the first to fifth embodiments described above, the coolant flow rate acquisition unit is a flowmeter or acquires the coolant flow rate based on the output, etc., of the pump and the opening, etc., of the valve; however, this is not limiting. For example, the coolant flow rate acquisition unit may be configured to estimate the coolant flow rate from an electric current in the electronic component, the temperature of the electronic component, and the temperature of the coolant that is introduced into the cooler.

Furthermore, in the first to fifth embodiments described above, a temperature sensor is used as the temperature acquisition unit, but this is not limiting. For example, the temperature acquisition unit may be configured to indirectly acquire the coolant temperature by calculation based on, for example, an electric current in the electronic component, the temperature of the electronic component, and the flow rate of the coolant.

In the case of an electronic component cooling device configured to operate by setting the temperature of the coolant to be supplied to the cooler to a predetermined value, for example, the temperature acquisition unit may be configured to store a predetermined temperature (for example, a constant temperature) that is set in advance.

This means that in the case of such an electronic component cooling device, the need for the temperature sensor and the flowmeter described in the first embodiment can be eliminated, as in the following modification (refer to FIG. 17).

Modifications

Figure 17:
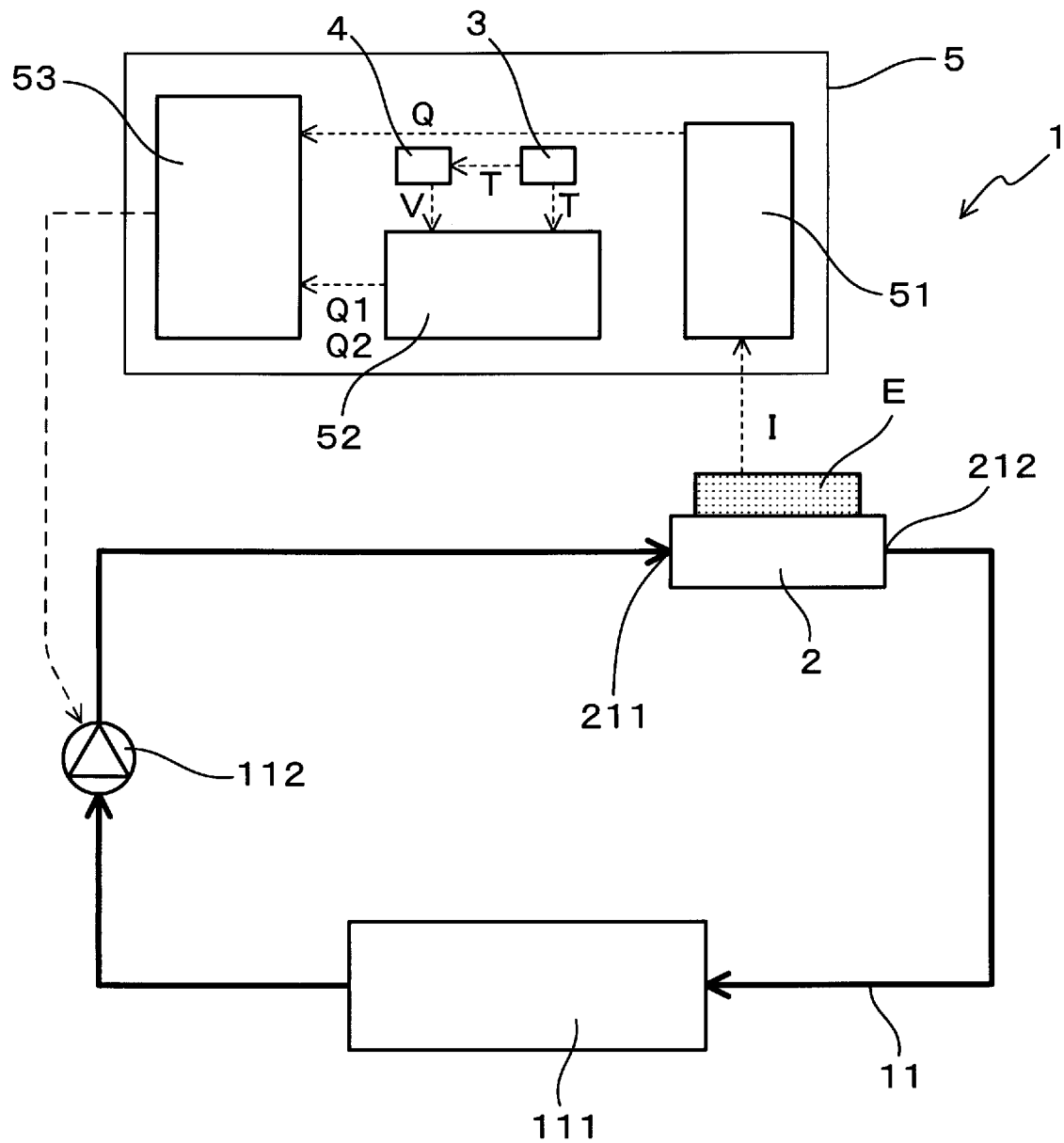
FIG. 17 conceptually illustrates an electronic component cooling device according to a modification.

In the electronic component cooling device 1 according to the present modification, for example, the coolant temperature acquisition unit 3 and the coolant flow rate acquisition unit 4 are provided inside the ECU 5, as illustrated in FIG. 17. The coolant temperature acquisition unit 3 receives and stores a predetermined coolant temperature T that has been set in advance as mentioned above. The coolant temperature T is transmitted to the loss threshold calculation unit 52 and also to the coolant flow rate acquisition unit 4. The coolant flow rate acquisition unit 4 calculates the coolant flow rate V in the cooler 2 using the coolant temperature T received from the coolant temperature acquisition unit 3 together with the electric current in the electronic component and the temperature of the electronic component.

Furthermore, the loss threshold calculation unit 52 calculates the upper limit threshold Q1 and the lower limit threshold Q2 of the heat loss from the electronic component E based on the coolant temperature T received from the coolant temperature acquisition unit 3 and the coolant flow rate V received from the coolant flow rate acquisition unit 4. The other details are substantially the same as those in the first embodiment.

The formation pattern of the inner fin described in each of the sixth to tenth embodiments is an example; other various forms can be used.

The present disclosure is not limited to each of the above-described embodiments and can be applied to various embodiments without departing from the principles and spirit of the present disclosure.

What is claimed is:

1. An electronic component cooling device comprising:
   a cooler which cools an electronic component by circulating a coolant through the cooler;
   a temperature sensor which acquires a temperature of the coolant that is introduced into the cooler;
   a flowmeter which acquires a flow rate of the coolant that circulates through the cooler;
   a non-transitory memory storing one or more computer programs; and
   a processor executing the one or more programs to:
     estimate a heat loss from the electronic component;
     calculate an upper limit threshold of the heat loss from the electronic component based on a coolant temperature acquired by the temperature sensor and a coolant flow rate acquired by the flowmeter, the upper limit threshold of the heat loss being an upper limit value of a reasonable heat loss with which dry-out of the coolant can be avoided; and
     in response to an estimated heat loss exceeding the upper limit threshold, control the flow rate of the coolant that circulates through the cooler so as to increase the flow rate of the coolant,
   wherein the coolant does not pass through an evaporator as the coolant circulates.

2. The electronic component cooling device according to claim 1, wherein
   the processor calculates a lower limit threshold of the heat loss from the electronic component based on the coolant temperature acquired by the temperature sensor and the coolant flow rate acquired by the flowmeter, the lower limit threshold being less than the upper limit threshold, and the lower limit threshold of the heat loss being a lower limit value of a reasonable heat loss with which excess of cooling ability is avoided, and in response to the estimated heat loss falling below the lower limit threshold, the processor decreases the flow rate of the coolant that circulates through the cooler.

3. An electronic component cooling device comprising:
a cooler which cools an electronic component by circulating a coolant through the cooler;
a temperature sensor which acquires a temperature of the coolant that is introduced into the cooler;
a flowmeter which acquires a flow rate of the coolant that circulates through the cooler;
a pressure sensor which acquires a flow path internal pressure in the cooler;
a non-transitory memory storing one or more computer programs; and
a processor executing the one or more programs to:
calculate an internal pressure amplitude that is an amplitude of oscillation of the flow path internal pressure acquired by the pressure sensor;
calculate an upper limit threshold of the internal pressure amplitude based on a coolant temperature acquired by the temperature sensor and a coolant flow rate acquired by the flowmeter, the upper limit threshold being set as an upper limit value of the internal pressure amplitude of the coolant that is not considered to induce dry-out after a first predetermined time even when a current coolant flow rate is maintained;
calculate a lower limit threshold of the internal pressure amplitude based on the coolant temperature acquired by the temperature sensor and the coolant flow rate acquired by the flowmeter, the lower limit threshold (i) being less than the upper limit threshold and (ii) being set as an upper limit value of the internal pressure amplitude of the coolant that is not considered to induce dry-out after a second predetermined time even when the current coolant flow rate is maintained, the second predetermined time being longer than the first predetermined time;
in response to the calculated internal pressure amplitude exceeding the upper limit threshold, control the flow rate of the coolant that circulates through the cooler so as to increase the flow rate of the coolant; and
in response to the calculated internal pressure amplitude falling below the lower limit threshold, control the flow rate of the coolant that circulates through the cooler so as to decrease the flow rate of the coolant,
wherein the coolant does not pass through an evaporator as the coolant circulates.

4. An electronic component cooling device which cools an electronic component, the electronic component cooling device comprising:

a cooling pipe which thermally contacts the electronic component, the cooling pipe having a coolant flow path through which a coolant circulates, a coolant inlet which is an entry for the coolant into the coolant flow path, and a coolant outlet which is an exit for the coolant from the coolant flow path, wherein a direction orthogonal to both a stacking direction of the cooling pipe and the electronic component and an alignment direction of the coolant inlet and the coolant outlet is defined as a width direction, outer flow paths are formed at both outer portions of the coolant flow path in the width direction, and a central flow path is formed at a central portion of the coolant flow path in the width direction between the both outer portions, each of the outer flow paths and the central flow path including an inner fin that is formed in a different pattern, the central flow path of the coolant flow path overlapping the electronic component in the width direction when viewed from the stacking direction, and the outer flow paths of the coolant flow path not overlapping the electronic component in the width direction when viewed from the stacking direction, the inner fin in each of the outer flow paths includes a plurality of separate angled portions disposed in alternating directions with respect to the alignment direction when viewed from the stacking direction, and a communication path which opens in the width direction is formed between ones of the separate angled portions that are adjacent to each other in the alignment direction, and flow path resistance of the central flow path is less than flow path resistance of each of the outer flow paths.

5. The electronic component cooling device according to claim 4, wherein
the inner fin of the central flow path is a continuous inner fin that is continuously formed between an upstream side of the electronic component and a downstream side of the electronic component in the alignment direction, and a plurality of branch flow paths separated from each other by the continuous inner fin are continuous without merging with each other between the upstream side of the electronic component and the downstream side of the electronic component.

6. The electronic component cooling device according to claim 4, wherein the plurality of separate angled portions are sloped at approximately 30 to 60 degrees with respect to the alignment direction when viewed from the stacking direction.

* * * * *